(12) United States Patent
Wallace et al.

(10) Patent No.: US 11,145,541 B2
(45) Date of Patent: Oct. 12, 2021

(54) CONDUCTIVE VIA AND METAL LINE END FABRICATION AND STRUCTURES RESULTING THEREFROM

(71) Applicant: Intel Corporation, Santa Clara, CA (US)

(72) Inventors: Charles H. Wallace, Portland, OR (US); Reken Patel, Portland, OR (US); Hyunsoo Park, Portland, OR (US); Mohit K. Haran, Hillsboro, OR (US); Debashish Basu, Beaverton, OR (US); Curtis W. Ward, Hillsboro, OR (US); Ruth A. Brain, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/637,930

(22) PCT Filed: Sep. 30, 2017

(86) PCT No.: PCT/US2017/054641
§ 371 (c)(1),
(2) Date: Feb. 10, 2020

(87) PCT Pub. No.: WO2019/066978
PCT Pub. Date: Apr. 4, 2019

(65) Prior Publication Data
US 2020/0185271 A1    Jun. 11, 2020

(51) Int. Cl.
*H01L 21/768* (2006.01)
*H01L 21/311* (2006.01)
*H01L 23/522* (2006.01)

(52) U.S. Cl.
CPC .. *H01L 21/76831* (2013.01); *H01L 21/31116* (2013.01); *H01L 21/7684* (2013.01);
(Continued)

(58) Field of Classification Search
None
See application file for complete search history.

(56) References Cited

U.S. PATENT DOCUMENTS 10,886,169 B2 * 1/2021 Cheng ............... H01L 23/53238
2013/0069244 A1   3/2013 Blatchford
(Continued)

FOREIGN PATENT DOCUMENTS

WO    WO-2016-209293    12/2016

OTHER PUBLICATIONS

International Preliminary Report on Patentability for International Patent Application No. PCT/US2017/054641, dated Apr. 9, 2020, 7 pgs.
(Continued)

*Primary Examiner* — Bradley Smith
(74) *Attorney, Agent, or Firm* — Schwabe, Williamson & Wyatt, P.C.

(57) ABSTRACT

Conductive via and metal line end fabrication is described. In an example, an interconnect structure includes a first inter-layer dielectric (ILD) on a hardmask layer, where the ILD includes a first ILD opening and a second ILD opening. The interconnect structure further includes an etch stop layer (ESL) on the ILD layer, where the ESL includes a first ESL opening aligned with the first ILD opening to form a first via opening, and where the ESL layer includes a second ESL opening aligned with the second ILD opening. The interconnect structure further includes a first via in the first via opening, a second ILD layer on the first ESL, and a metal line in the second ILD layer, where the metal line is in contact with the first via, and where the metal line includes a first metal opening, and where the metal line includes a second metal opening aligned with the second ILD opening and the ESL opening to form a second via opening. The
(Continued)

interconnect structure further includes a metal line end in the first metal opening and further includes a second via in the metal line, where the second via is in the second via opening.

18 Claims, 18 Drawing Sheets

(52) U.S. Cl.
CPC .. *H01L 21/76816* (2013.01); *H01L 21/76843* (2013.01); *H01L 21/76877* (2013.01); *H01L 23/5226* (2013.01)

(56) References Cited

U.S. PATENT DOCUMENTS

2016/0190009 A1 6/2016 Wallace et al.
2016/0365276 A1 12/2016 Wu et al.
2017/0098606 A1 4/2017 Lu et al.
2017/0330794 A1* 11/2017 Hourani .............. H01L 23/3171

OTHER PUBLICATIONS

International Search Report and Written Opinion for International Patent Application No. PCT/US2017/054641 dated Jun. 29, 2018, 10 pgs.

\* cited by examiner

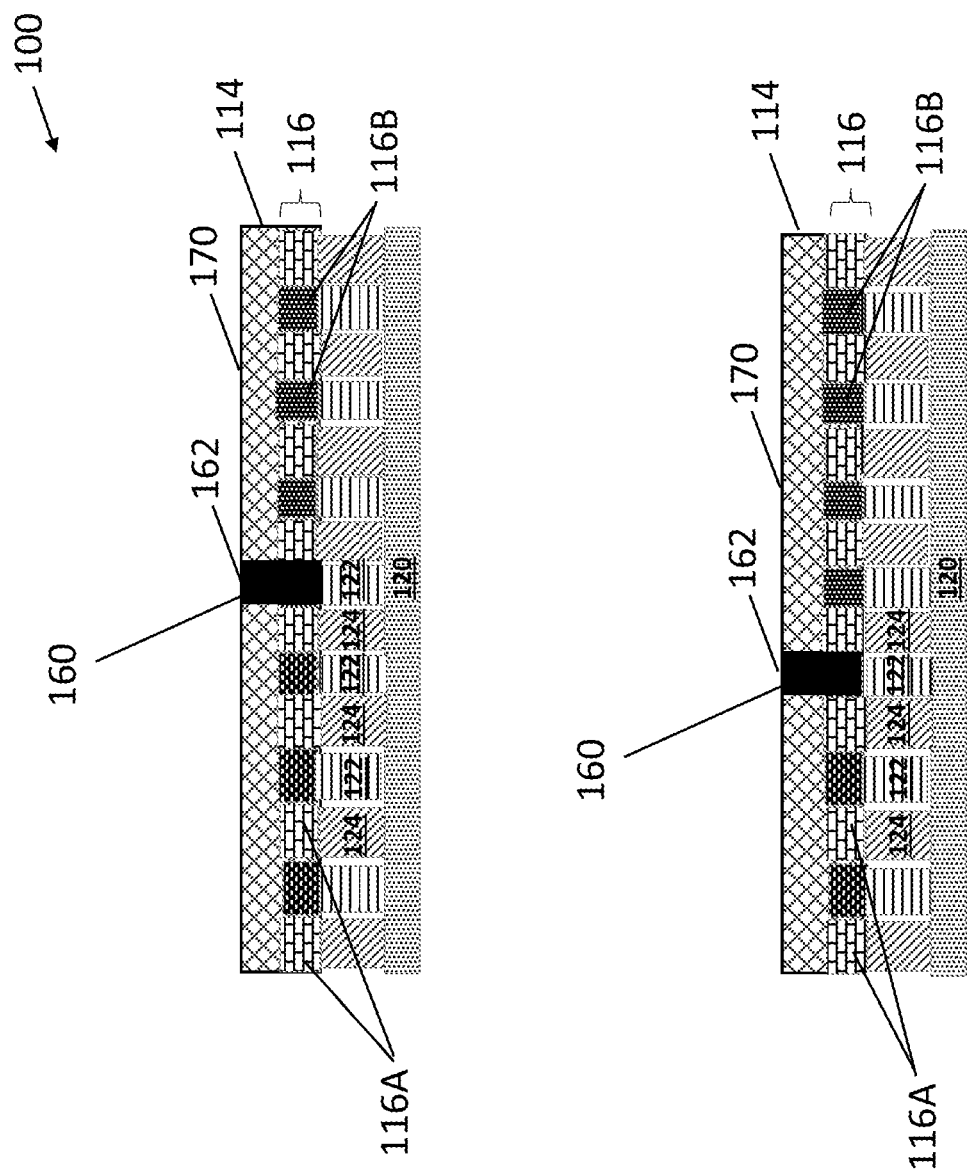

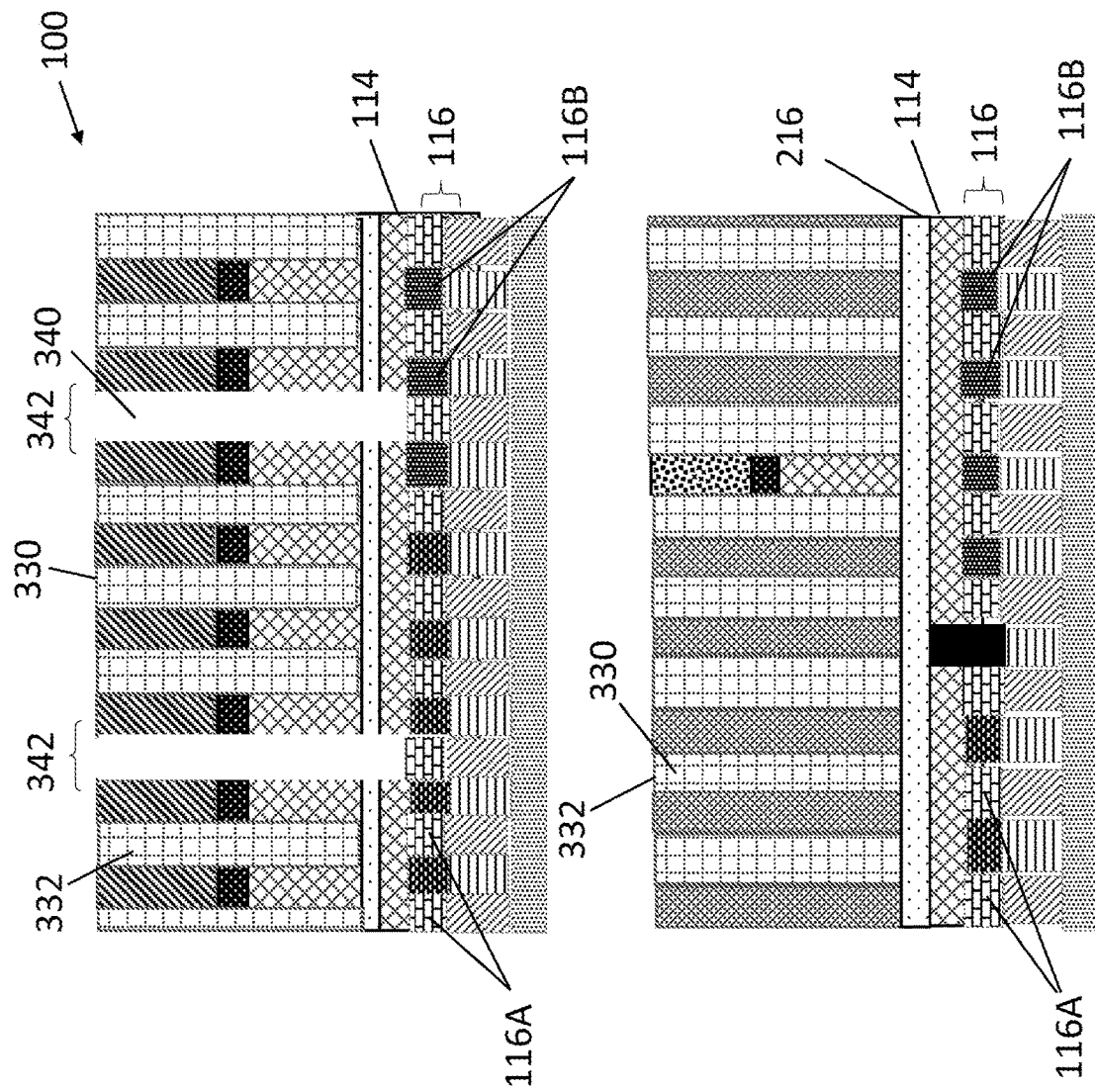

CONDUCTIVE VIA AND METAL LINE END FABRICATION AND STRUCTURES RESULTING THEREFROM

CROSS-REFERENCE TO RELATED APPLICATION

This patent application is a U.S. National Phase Application under 35 U.S.C. § 371 of International Application No. PCT/US2017/054641, filed Sep. 30, 2017, entitled "CONDUCTIVE VIA AND METAL LINE END FABRICATION AND STRUCTURES RESULTING THEREFROM," which designates the United States of America, the entire disclosure of which is hereby incorporated by reference in its entirety and for all purposes.

TECHNICAL FIELD

Embodiments of the disclosure are in the field of semiconductor structures and processing and, in particular, conductive via and metal line end fabrication, and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, leading to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the art as vias, to electrically connect metal lines or other interconnects above the vias to metal lines or other interconnects below the vias. Integrated circuits also may include nonconductive spaces or interruptions between metals, which are known in the art as metal line ends. Vias and metal line ends are typically formed by a lithographic process. Representatively, for example, with regard to vias, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 1A, 1B, 1C, 1D, 1E, 1F, 1G, 1H, 1I, 1J, 1K, 1L, 1M, and 1N illustrate cross-sectional views of portions of interconnect structure layers representing various operations in a process involving conductive via and metal line end formation for back end of line (BEOL) interconnect fabrication, in accordance with an embodiment of the present disclosure.

DESCRIPTION OF THE EMBODIMENTS

Figure 1A:
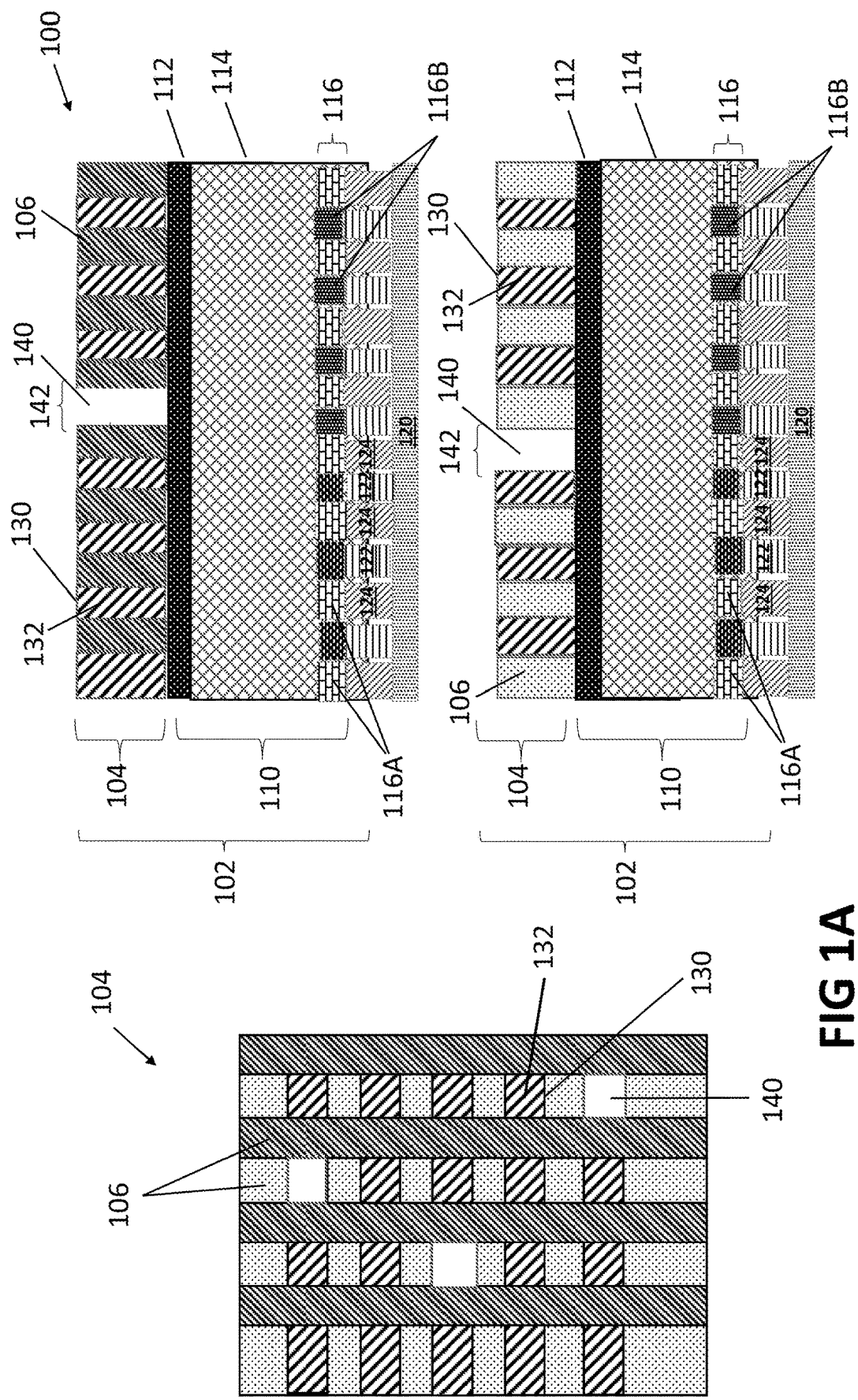

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70-90 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly several different lithographic masks may be used, which tend to increase the costs. At some point, if pitches continue to decrease, it may not be possible, even with multiple masks, to print via openings for these extremely small pitches using EUV scanners.

An additional such challenge is related to edge placement error. Interconnect structures typically require a single etch stop between critical layers. In patterning processes, an etch for a via from the layer above typically needs to break through an etch stop layer to land on the metal beneath the via. Lithography constraints (e.g., resolution and alignment) introduced by scaling may result in via patterns that are too large and that could undesirably land on two adjacent metal lines, which may be referred to as edge placement error.

Thus, improvements are needed in the area of back end metallization manufacturing technologies for fabricating conductive vias and metal line ends.

Conductive via and metal line end fabrication, and the resulting structures, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below", and "under" refer to directions in the drawings to which reference is made. Terms such as "front", "back", "top", "bottom", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments are directed to conductive vias and metal line end fabrication. As described in more detail below, in conjunction with an alternating underlayer, a pin-hole ash patterning process may be used to pattern a single damascene gate via, a metal line end, and a dual-damascene diffusion via, which also may be referred to as a trench via. Conductive vias, or vias, by definition, land on a previous layer metal pattern, while metal line ends, or line ends, form non-conductive spaces in metal lines. In this vein, embodiments described herein enable a more robust interconnect fabrication scheme, since constraints on lithography equipment is relaxed. Such an interconnect fabrication scheme can be used to save numerous alignment/exposures, and can be used to reduce total process operations and processing time otherwise required for patterning such features using conventional approaches, such as, for example, patterning that includes an alternating underlayer and formation of metal lines, vias, and line ends independently. Other benefits may include improvements in yield, or the prevention of shorting to a wrong line due to, for example, edge placement error.

Figure 1B:
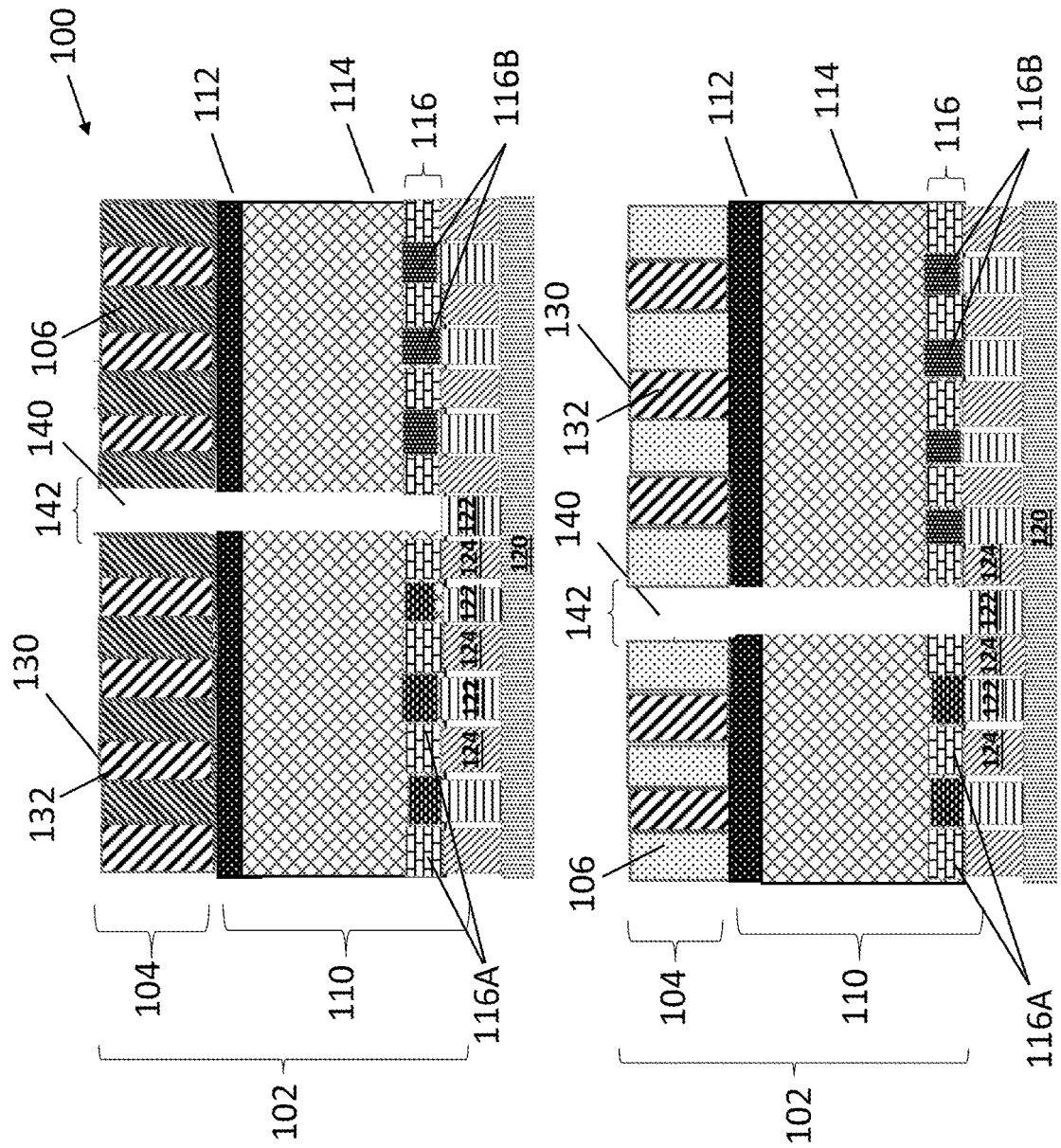
Figure 1C:
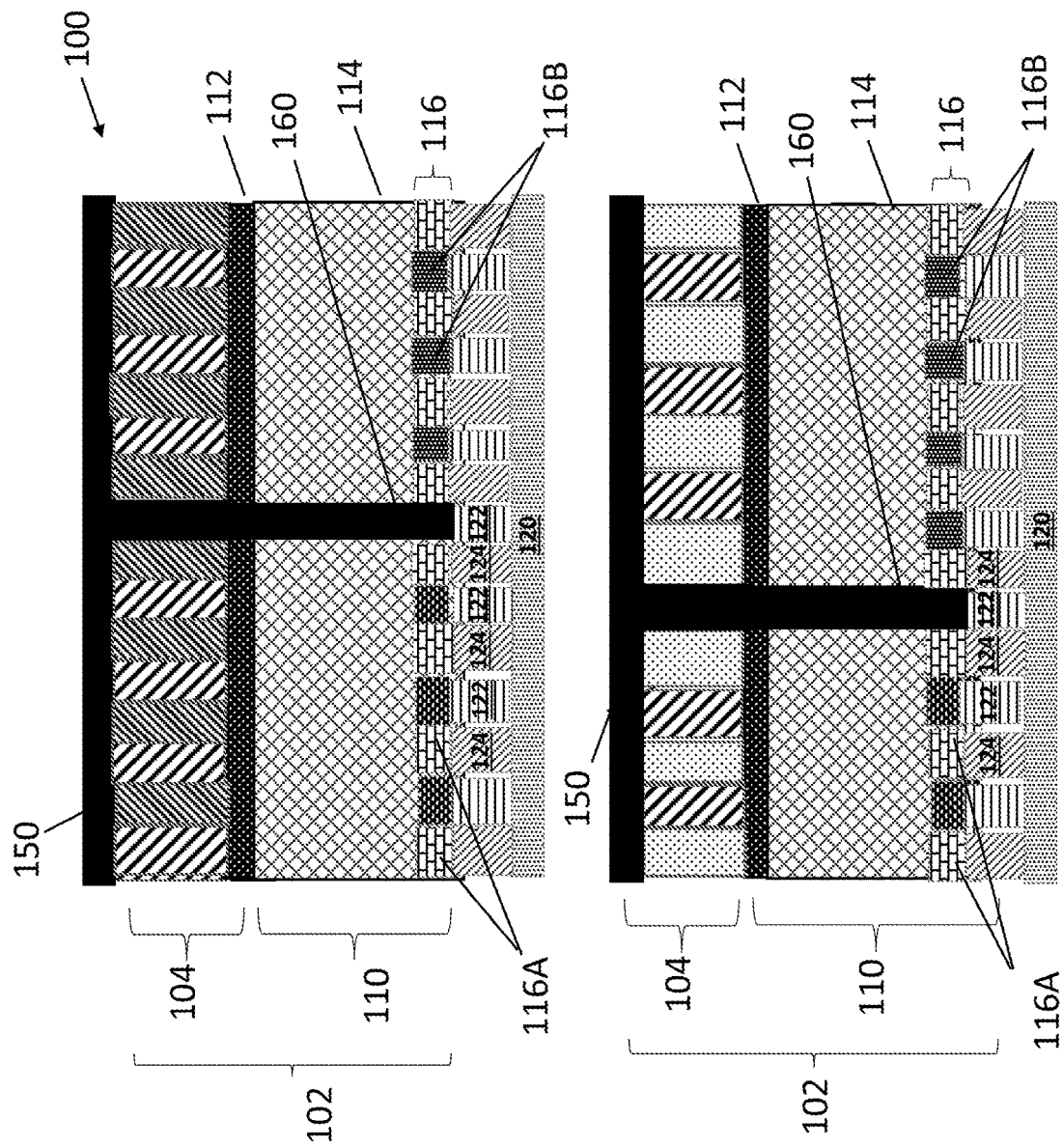
Figure 1E:
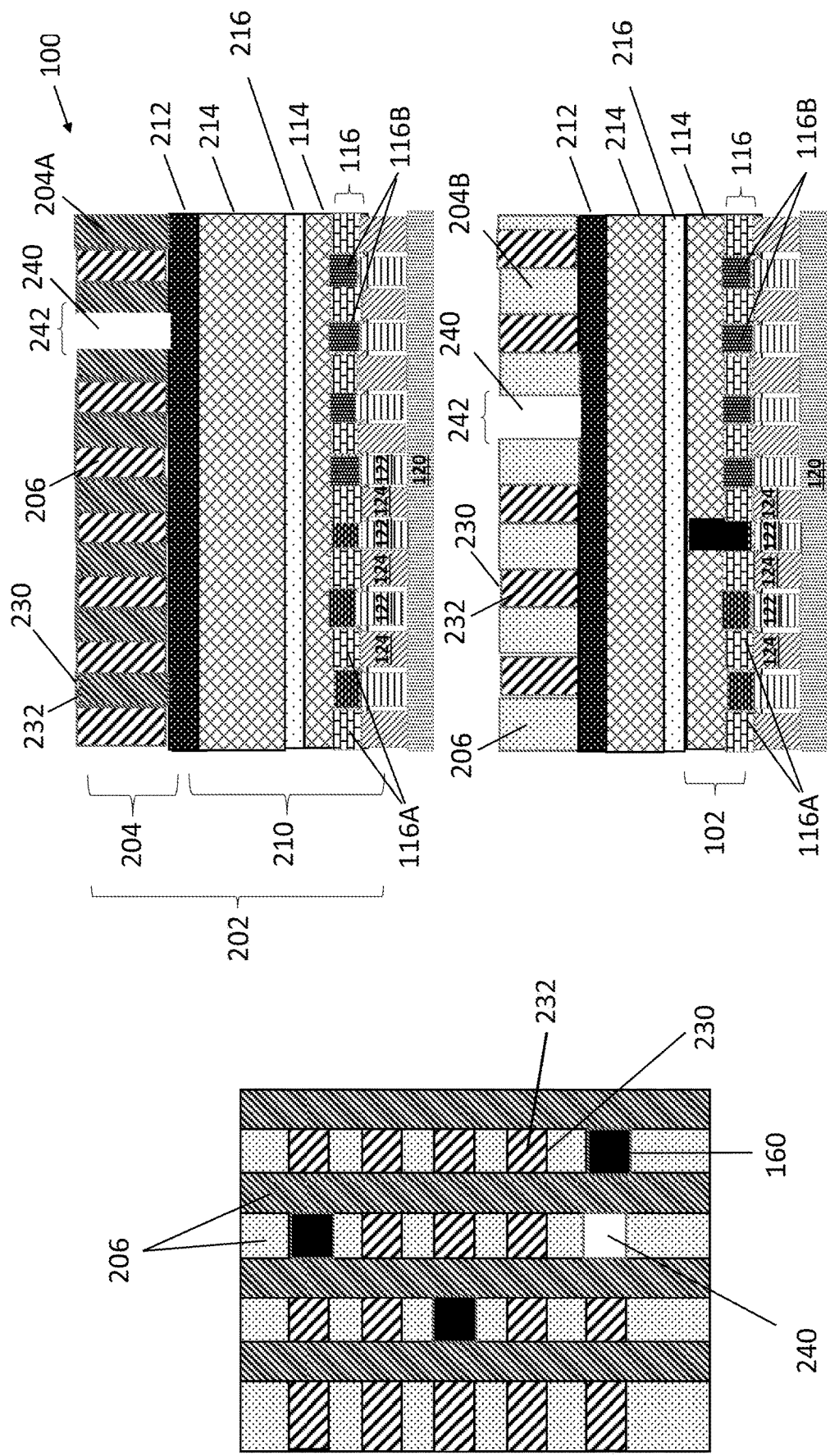
Figure 1F:
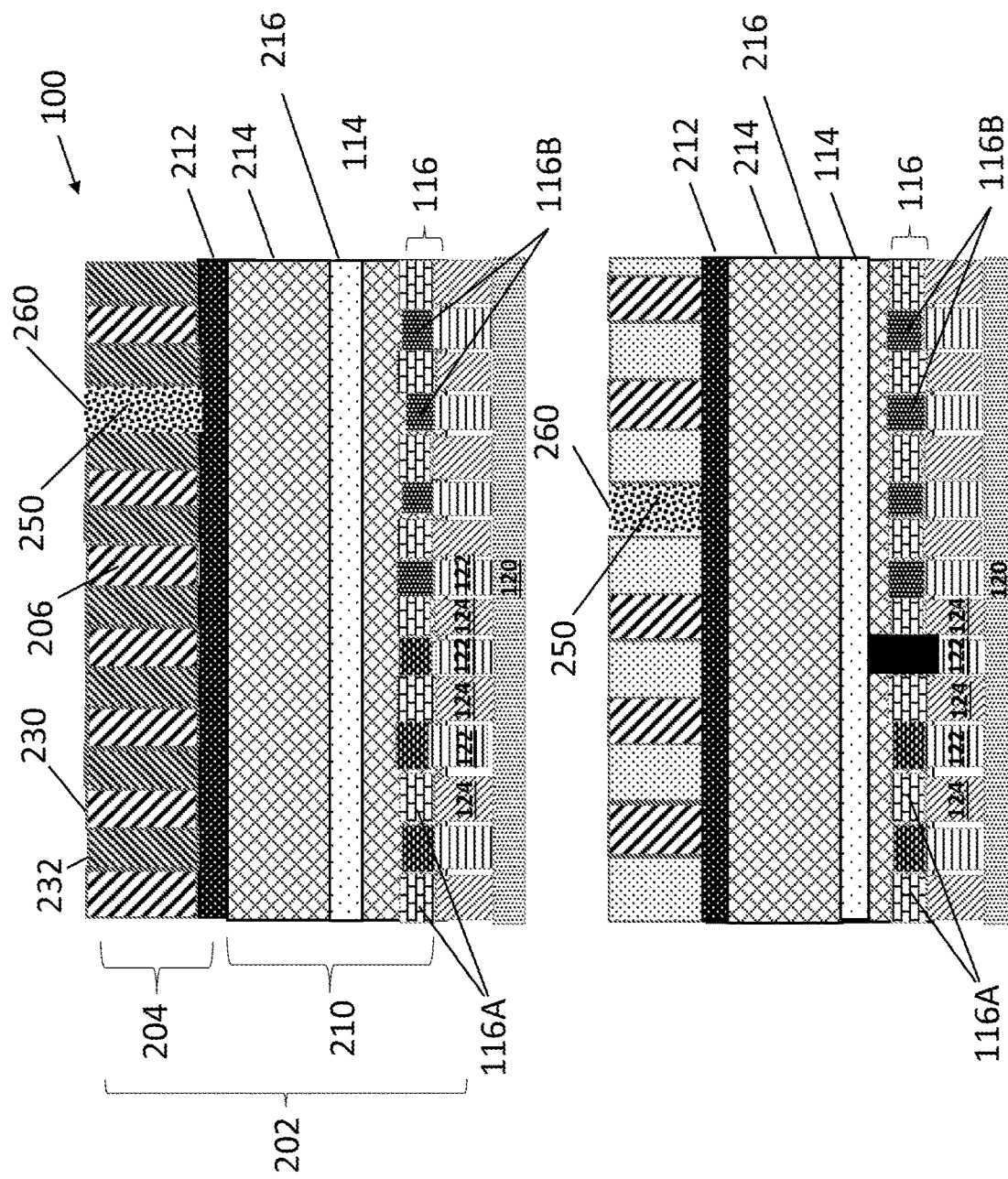
Figure 1G:
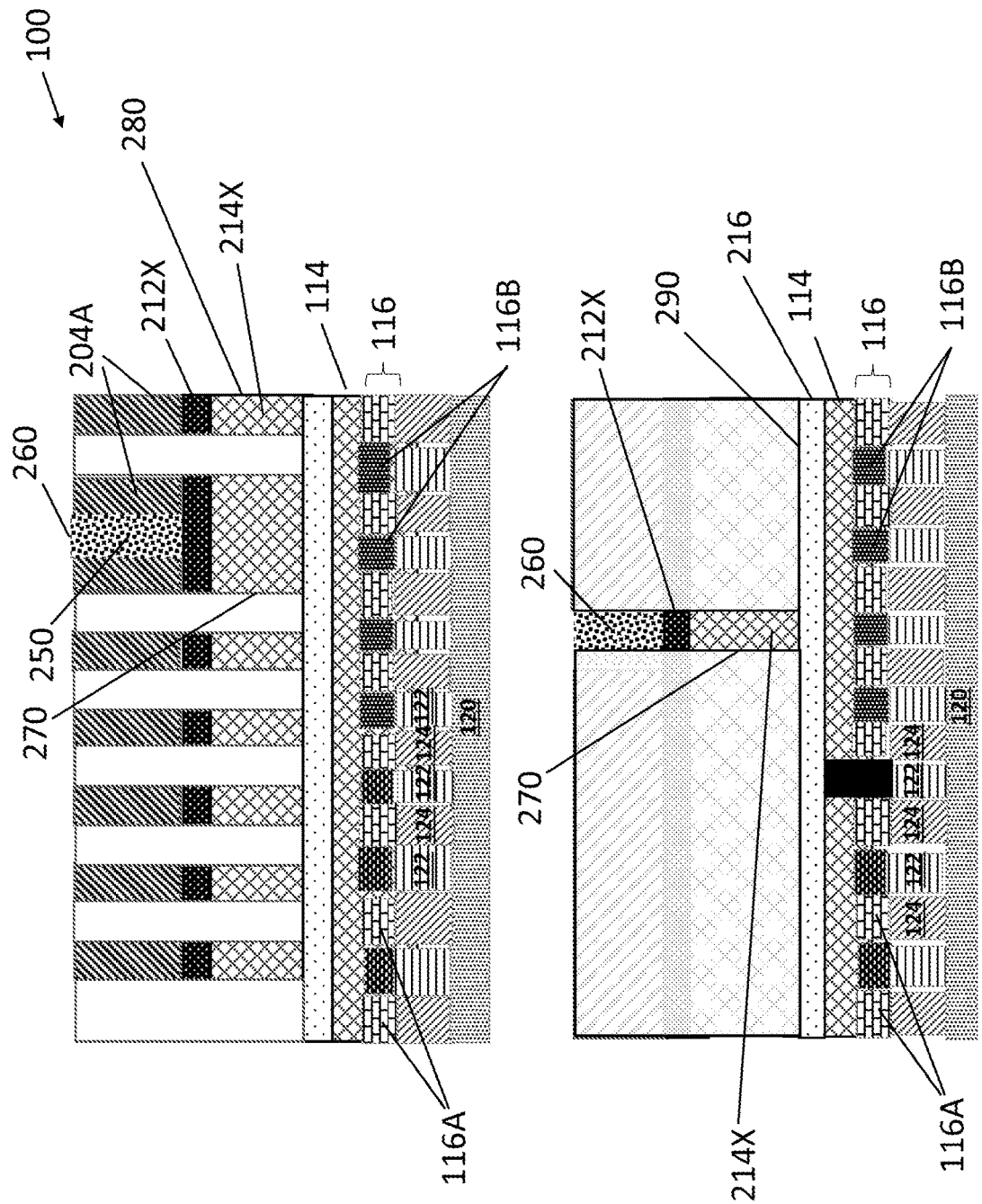
Figure 1H:
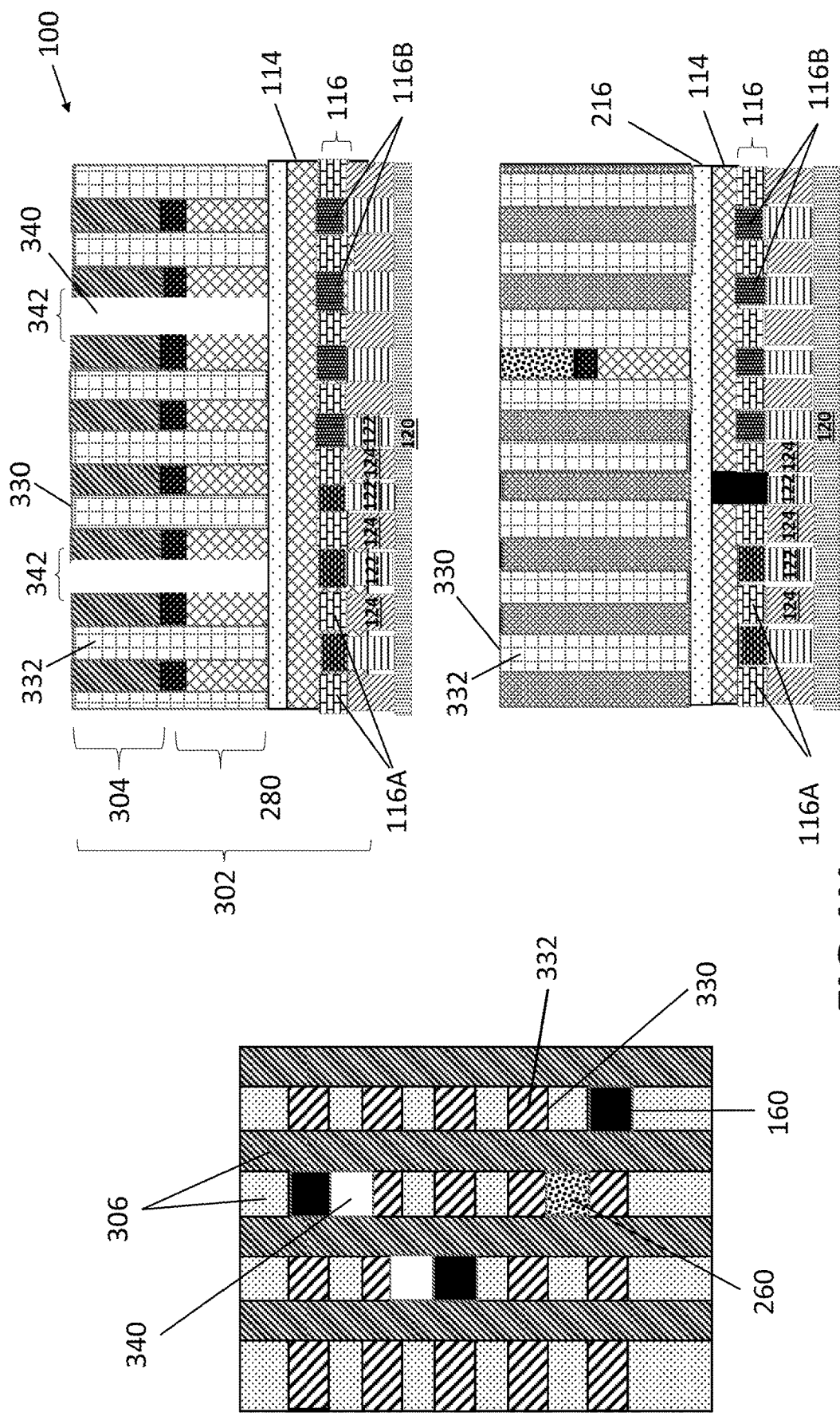
Figure 1J:
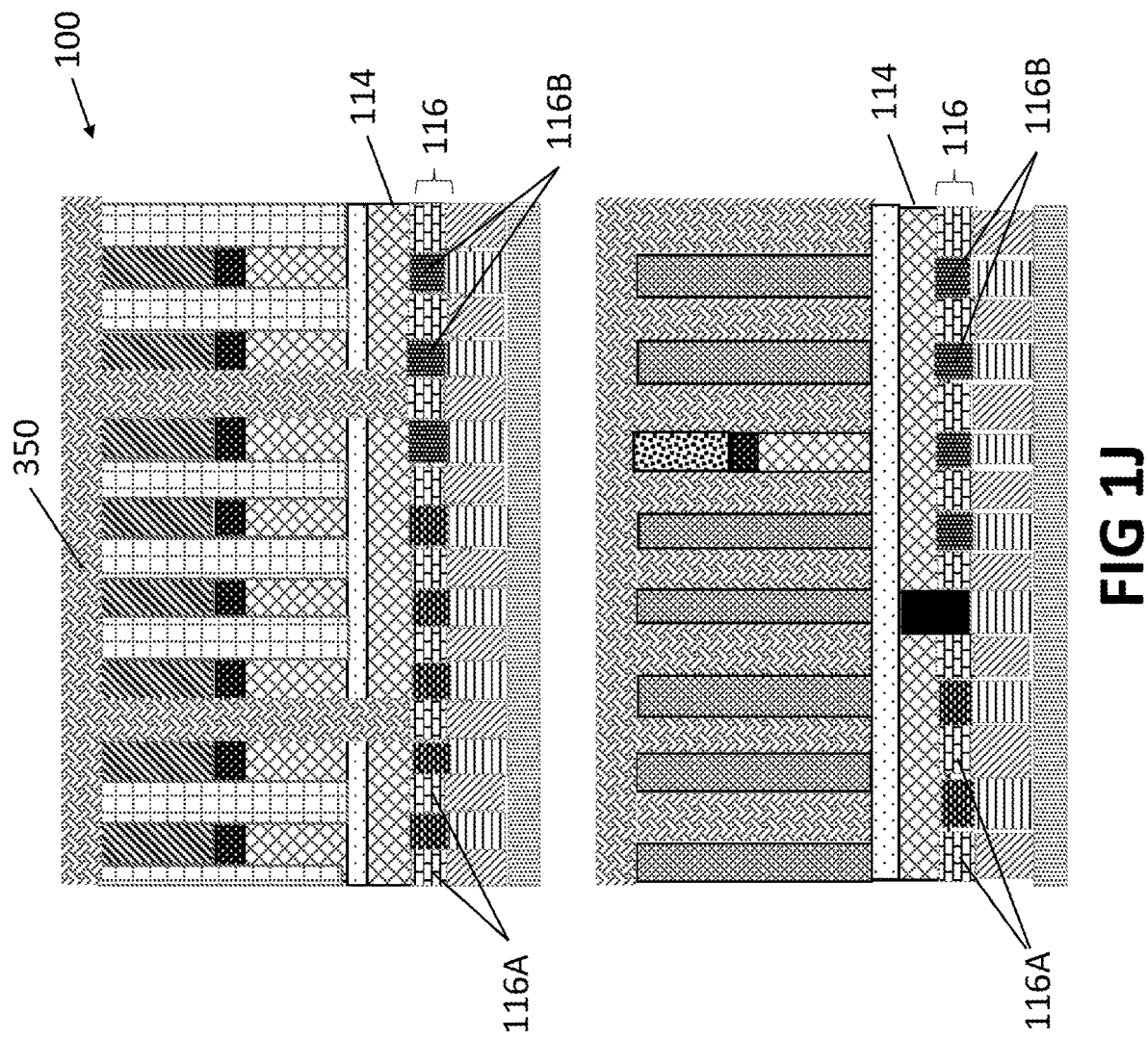
Figure 1K:
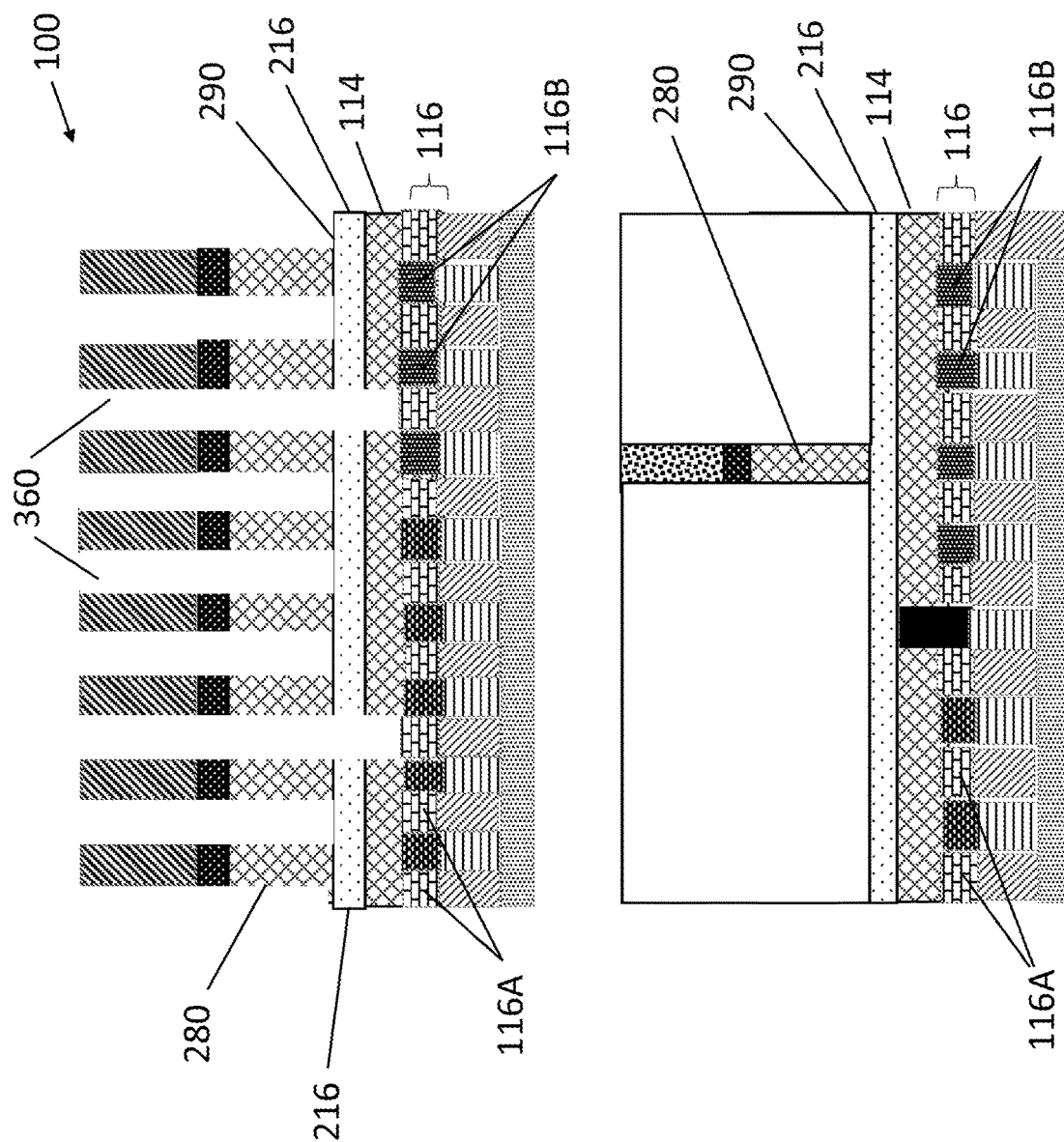
Figure 1L:
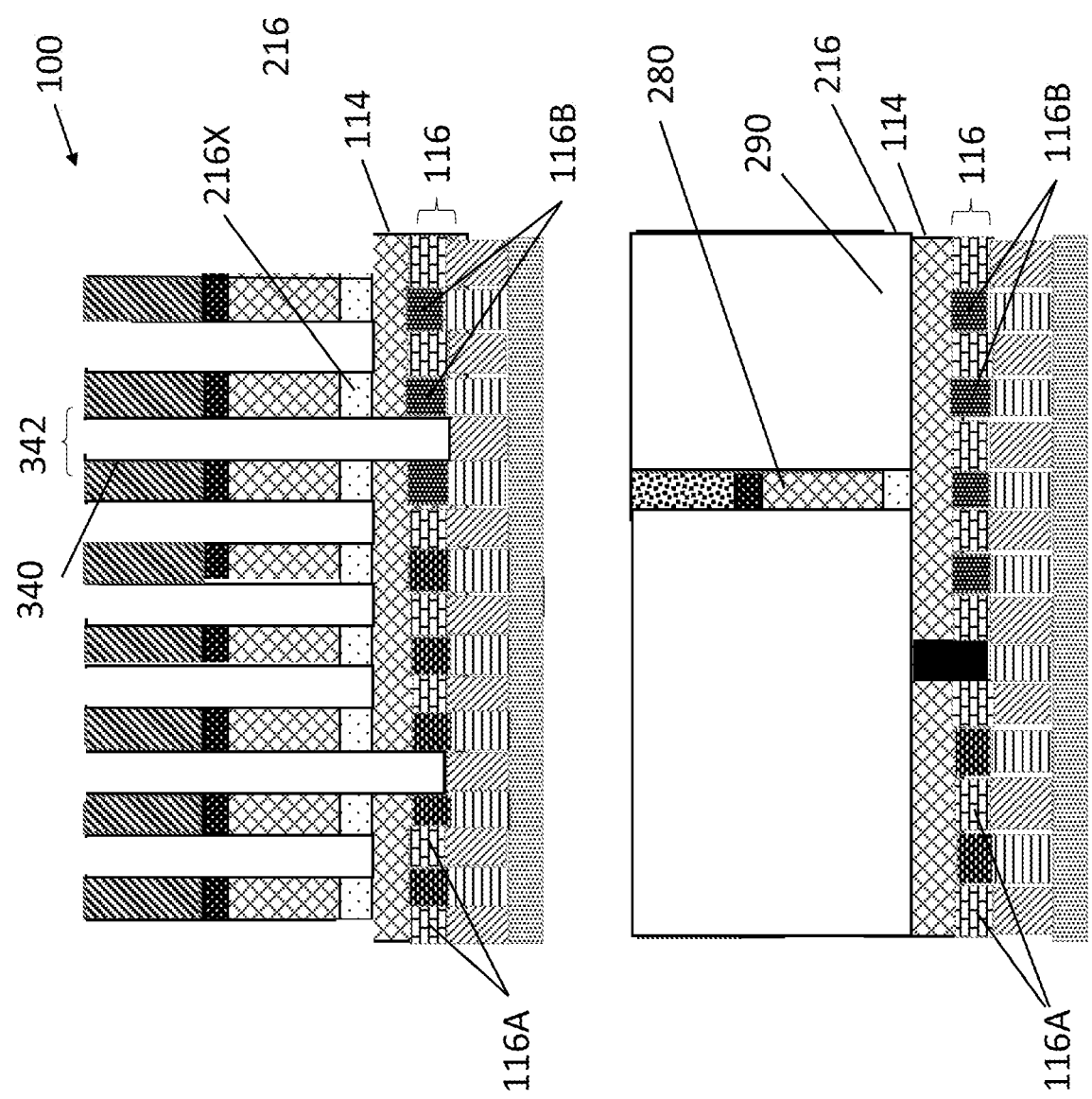
Figure 1M:
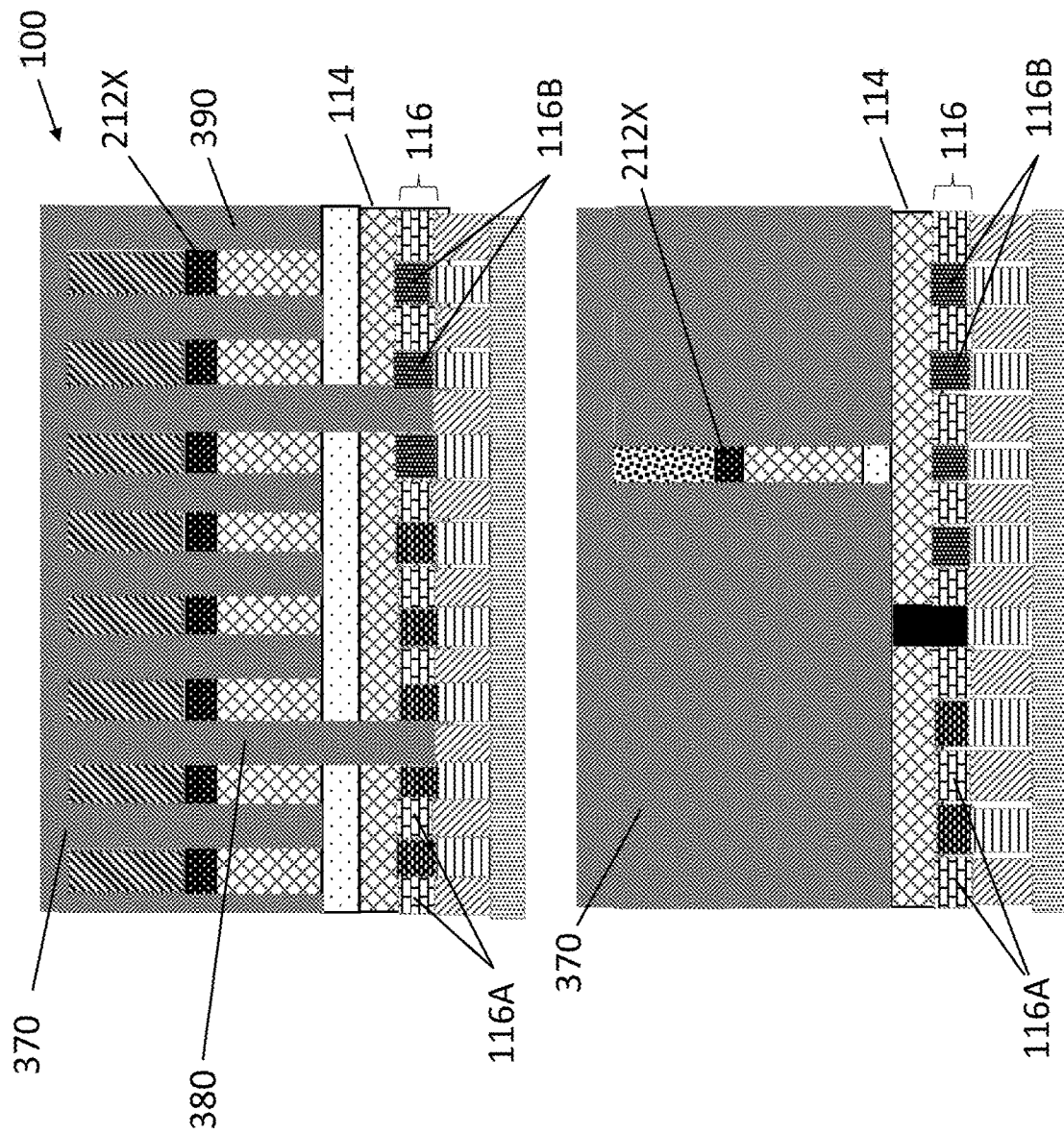
Figure 1N:
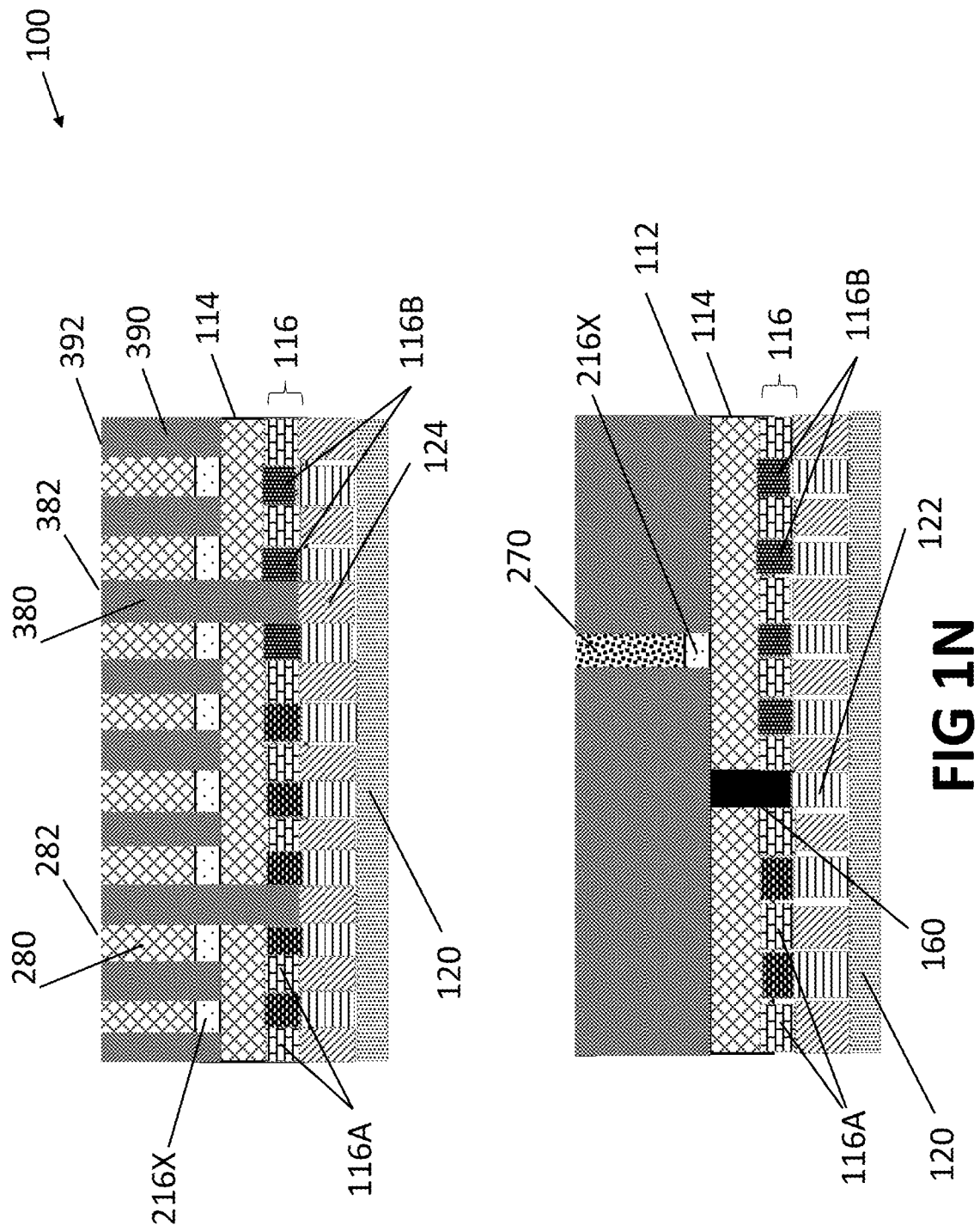

FIGS. 1A-1N illustrate cross-sectional views of portions of integrated circuit layers representing various operations in a process involving conductive via and metal line end formation for BEOL interconnect fabrication, in accordance with an embodiment of the present disclosure. In an illustration at a described operation, a top view illustrating a cross-grating may be shown on the left-hand side for some operations, front cross-sectional views are shown on the top right-hand side, and side cross-section views are shown on the bottom right-hand side. These views may be referred to herein as top views and cross-sectional views. In addition, a figure may include an element or elements that have a reference number in one figure that may not be repeated in a subsequent figure, in which case the earlier reference number applies to any subsequent instance of the element in a figure that does not include the earlier depicted reference number.

Referring to FIG. 1A, an interconnect structure 100 that includes a first cross-grating structure 102 is formed as a beginning point for fabricating conductive vias and metal line ends. The first cross-grating structure 102 may include a first sacrificial cross-grating 104 on a first film stack 110. The first sacrificial cross-grating 104 may include first cross-grating material 106 such as, for example, but not limited to, metals, such as, for example, but not limited to, aluminum, titanium, zirconium, or tantalum; various oxides, nitrides, or carbides, such as, for example, but not limited to, aluminum oxide, titanium oxide, zirconium oxide, tantalum oxide, titanium nitride, tantalum nitride, silicon nitride, silicon carbide, or silicon dioxide; or semiconductor, such as, for example, but not limited to, amorphous silicon. Material for the sacrificial cross-grating 104 may be chosen based on, at least in part, etch selectivity, for example.

The first film stack 110 may include a first sacrificial layer 112 that may include a first sacrificial material; on a first inter-layer dielectric (ILD) layer 114 that may include first ILD material; on a hardmask layer 116 that may include hardmask material. Although shown as a single layer, the first sacrificial layer 112 may include more than one layer, and each layer may include the same material as another layer or different material than another layer. Additionally or alternatively, a portion of the first sacrificial layer 112 may be or become part of the sacrificial cross grating 104. The first sacrificial layer 112 may include material such as, for example, but not limited to, metals, such as, for example, but not limited to, aluminum, titanium, zirconium, or tantalum; various oxides, nitrides, or carbides, such as, for example, but not limited to, aluminum oxide, titanium oxide, zirconium oxide, tantalum oxide, titanium nitride, tantalum nitride, silicon nitride, silicon carbide, or silicon dioxide; or semiconductor, such as, for example, but not limited to, amorphous silicon. Material for the first sacrificial layer 112 may be chosen based on, at least in part, etch selectivity, for example.

The hardmask layer 116 may include a first via guide section 116A adjacent to a second via guide section 116B. The hardmask material of first via guide sections 116A is a hardmask material different than the hardmask material of the second via guide sections 116B and hardmask layer 116. Representatively, the hardmask material of the second via guide sections 116A may include a dielectric material which is sufficiently different chemically than the material of first via guide sections 116A and hardmask layer 116 to allow for etching of the hardmask material of second via guide sections 116B selective to first via guide sections 116A and hardmask layer 116. Representative dielectric materials may include, but are not limited to, various oxides, nitrides and carbides, for example, silicon oxide, titanium oxide, hafnium oxide, aluminum oxide, oxynitride, zirconium oxide, hafnium silicate, lanthanum oxide, silicon nitride, boron nitride, amorphous carbon, silicon carbide and other similar dielectric materials. For example, where hardmask layer 116 may be formed using silicon oxide, and first via guide sections 116A may include silicon nitride, second via guide sections 116B may include silicon carbide.

The resulting structure 100 therefore may include hardmask layer 116 having first via guide sections 116A of one hardmask material alternating with second via guide sections 116B of another, different, hardmask material. In addition, each of first via guide sections 116A and second via guide sections 116B may be separated by a third hardmask material, namely that of hardmask layer 116, that is different from the hardmask materials of each of the via guide sections 116A and 116B. In this aspect, a hardmask layer 116 having at least three different hardmask materials with different etch selectivities, all within a single hardmask layer, may be formed. The at least three different hardmask materials may alternate throughout the hardmask layer 116 such that no two of the same hardmask materials contact one another within hardmask layer 116. Although three different materials are described as being used in hardmask layer 116, hardmask layer 116 may include more or fewer materials.

In an embodiment, first via guide sections 116A or second via guide sections 116B may be gate via guide sections, such as guide sections for gate contacts of a metal oxide semiconductor field effect transistor (MOSFET) device. In an embodiment, first via guide sections 116B or second via guide sections 116B may be diffusion via guide sections, such as guide sections for diffusions contacts, such as, for example, source or drain contacts of a MOSFET device. Although via guide sections 116A and 116B may be described with regard to a MOSFET device, embodiments herein are not limited to MOSFET devices. Embodiments herein may be used with any other type of device, such as, for example, but not limited to, a bipolar junction transistor (BJT) device. In such an embodiment, first via guide sections 116A or second via guide sections 116B may be base contact, emitter contact, or collector contact via guide sections. FIG. 1A further depicts a semiconductor substrate 120 that may includes gate contact 122 and diffusion contact 124, which may be, for example, a source or a drain of a MOSFET device.

The first sacrificial cross-grating 104 may include a plurality of potential gate via locations 130 that may include a gate via placeholder material 132. Potential gate via locations 130 may be the locations where all possible gate vias may be formed in first cross-grating structure 102. The first sacrificial cross-grating 102 may further include activated gate via locations 140, which may be a subset of the potential gate via locations 130 that may include gate via openings 142 from which the gate via placeholder material 132 has been removed. First cross-grating material 106 may surround the potential gate via locations 130 and the activated gate via locations 140.

In an embodiment, the gate via placeholder material 132 may be removed at the potential gate via locations 130 by an isotropic etching process. In one such embodiment, the gate via placeholder material 132 may be an organic polymer, such as, for example, carbon hardmask (CHM), and the isotropic etching process, which may be referred as "pinhole ash," may be an isotropic plasma ash (oxygen plasma) or wet cleans process. Thus, an isotropic etch processing may be used together with a hole shrink process, with pinhole patterning in, for example, a mask layer, such as, for example, a relatively thin low-temperature oxide mask layer, formed on the underlying structure. Openings in the mask layer may be substantially smaller than the exposed sacrificial placeholder material. The formation of openings that may be relatively smaller than exposed placeholder material may provide a markedly increased tolerance for edge placement error. The process effectively "shrinks" the via locations to the sizing of "pinholes" with respect to selection and patterning of the actual via locations. In an embodiment, the mask layer may be patterned with openings by first forming and patterning a photo-sensitive material on the mask layer by a lithographic process, such as a positive tone lithographic process, and then patterning the mask layer by an etch process. This process may be referred to as a pin-hole ash process.

The subset of potential gate via locations 140 may include any number of potential gate via locations from one potential gate via location to all of the potential gate via locations 130. Further, orthogonal lines in the first sacrificial cross-grating 104 that intersect to form the potential gate via locations 130 may be spaced at a constant pitch and have a constant width. In other embodiments, the pitch does not need to be constant, nor does the width. It is to be appreciated that sacrificial cross-grating 104 may be fabricated by numerous approaches, including, for example, but not limit to, a pitch halving approach, a pitch quartering approach, 193 nm immersion lithography (193i), extreme ultra-violet (EUV) and/or electron-beam direct write (EBDW) lithography, directed self-assembly (DSA), directed selective growth, etc.

The process operation for forming the cross-grating structure of FIG. 1A, as well as the cross-grating structures in FIGS. 1E and 1H below, may involve depositing layers to create the lines that intersect to form the plurality of potential via or plug locations, and etching through the layers to identify the subset of the potential via or plug locations. The layers may include a lid directly on the lines, through which a final etch may occur to identify the subset of potential via or plug locations from which to remove placeholder material, and to create a hermetic seal to protect from etch plasma the positions not identified in the subset of potential via or plug locations. Further, the description of or figures depicting the cross-grating structures of FIG. 1A, as well as in FIGS. 1E and 1I below, may not include various layers or process operations that may otherwise be necessary for forming the sacrificial cross-gratings. However, for clarity, such layers or process operations may not be included, because they do not impact the overall concept. Similarly, layers, features, or other aspects may be hidden or may be in the background in embodiments herein. However, for clarity, such layers, features, or other aspects may not be included, described, or illustrated, because they do not impact the overall concept.

Referring to FIG. 1B, first film stack material may be removed from the bottom of the activated gate via locations 140. In an embodiment, the first film stack material may be removed through to a gate via guide section, for example, second via guide section 116B, where the gate via guide section is above or beside a gate contact, such as gate contact 122. In an embodiment, the first film stack material may be removed through to a gate contact, such as gate contact 122 under or beside first via guide section 116A or second via guide section 116B. In an embodiment, removing the first stack material from the bottom of the activated first via locations 140 may include applying an anisotropic etch technique. In an embodiment, applying the anisotropic etch technique may include using a dry etching process. The etch process may be anisotropic in the sense that material that is accessible in the activated first via locations 140 may be etched selectively in a particular direction, such as, for example, towards hardmask layer 116. This may enable, for example, the ability to define a feature that may include a straight or relatively straight edge, in order to avoid, for example, creating an electrical short to an adjacent feature.

Referring to FIG. 1C, the activated gate via locations 140 may be filled with a first conductive material 150 to form a gate via 160. In an embodiment, the first conductive material may be composed of a material such as, but not limited to, aluminum, titanium, zirconium, hafnium, vanadium, ruthenium, cobalt, nickel, palladium, platinum, copper, tungsten, or gold, silver, or alloys thereof. In an embodiment, a gate via may be formed by a single damascene metallization process. In a single damascene metallization process, metal features, such as, for example, metal lines and vias, may each be formed in separate process operations.

In an embodiment, activated gate via locations 140 may be filled with excess conductive material 150, and a subsequent polish operation and planarization operation may be performed. In the case that the excess conductive material 150 is planarized following deposition, a chemical mechanical polishing (CMP) process may be used. In another embodiment, however, the activated via location 140 is filled without metal overfilling, and the polishing operation is omitted. In an embodiment, the conductive material 150 may be a single material layer, or may be formed from several layers, including conductive liner layers and fill layers. Any suitable deposition process, such as electroplating, chemical vapor deposition, physical vapor deposition, or spin-on, may be used to fill the activated gate via location 140 with the conductive material 150.

Referring to FIG. 1D, the first sacrificial cross-grating 104 may be removed to expose a surface 170 of the first ILD layer 114 and a surface 162 of the gate via 160 in the first ILD layer 114, where removal of the first sacrificial cross-grating 104 may include removal of the remainder of the first film stack 110 above the first ILD layer 114. The surface 170 of the first ILD layer 114 and the surface 162 of the gate via 160 may be planarized following removal of the first sacrificial cross-grating 104. In an embodiment, removing the first sacrificial cross grating 104 may include applying an isotropic etch technique. In an embodiment, applying the isotropic etch technique may include using a wet etching. The etch process may be isotropic in the sense that material may be etched in more than one direction, to remove material wherever it is exposed.

Referring to FIG. 1E, a second cross-grating structure 202 may be formed on the surface 170 of the first ILD layer 114. The second cross-grating structure 202 may include a second sacrificial cross-grating 204 on a second film stack 210. The second sacrificial cross-grating 204 may include first portions 204A and second portions 204B. The second sacrificial cross-grating 204 may include second cross-grating material 206 such as, for example, but not limited to, aluminum, titanium, zirconium, or tantalum; various oxides, nitrides, or carbides, such as, for example, but not limited to, aluminum oxide, titanium oxide, zirconium oxide, tantalum oxide, titanium nitride, tantalum nitride, silicon nitride, silicon carbide, or silicon dioxide; or semiconductor, such as, for example, but not limited to, amorphous silicon. Material for the sacrificial cross-grating 204 may be chosen based on, at least in part, etch selectivity, for example.

The second sacrificial cross-grating 204 may include a plurality of potential plug locations 230 that may include a plug placeholder material 232. Potential plug locations 230 may be the locations where all possible plugs, and thus metal line ends, may be formed in the second cross-grating structure 202. The second sacrificial cross-grating 204 may further include a subset of the potential plug locations 230 that are activated plug locations 240 that may include a plug opening 242 from which the plug placeholder material 232 has been removed. Second cross-grating material 206 may surround the potential plug locations 230 and activated plug locations 240.

The subset of potential plug locations 240 may include any number of potential plug locations, from one potential plug location to all of the potential plug locations 230. Further, orthogonal lines in second sacrificial cross-grating 204 that intersect to form the potential plug locations 240 may be spaced at a constant pitch and have a constant width. In other embodiments, the pitch does not need to be constant, nor does the width. It is to be appreciated that the second sacrificial cross-grating 204 may be fabricated by numerous approaches, including, but not limit to, a pitch halving approach, a pitch quartering approach, 193 nm immersion lithography (193*i*), extreme ultra-violet (EUV) and/or electron-beam direct write (EBDW) lithography, directed self-assembly (DSA), directed selective growth, etc.

The second film stack 210 may include a second sacrificial layer 212 that may include a second sacrificial layer material; on a second ILD layer 214 that may include a second ILD layer material; on an etch stop layer (ESL) 216 that may include ESL material, which may also be referred to herein as ES material. The ESL material may include a dielectric material, which may include, but is not limited to, various oxides, nitrides and carbides, for example, silicon oxide, titanium oxide, hafnium oxide, aluminum oxide, oxynitride, zirconium oxide, hafnium oxide, lanthanum oxide, silicon nitride, boron nitride, amorphous carbon, silicon carbide and other similar dielectric materials. Although shown as a single layer, the second sacrificial layer 212 may include more than one layer, and each layer may include the same material as or different material than another layer. Additionally or alternatively, a portion of the second sacrificial layer 212 may be or become part of the second sacrificial cross grating 204. The second sacrificial layer 212 may include material such as, for example, but not limited to, metals, such as, for example, but not limited to, aluminum, titanium, zirconium, or tantalum; various oxides, nitrides, or carbides, such as, for example, but not limited to, aluminum oxide, titanium oxide, zirconium oxide, tantalum oxide, titanium nitride, tantalum nitride, silicon nitride, silicon carbide, or silicon dioxide; or semiconductor, such as, for example, but not limited to, amorphous silicon. Material for the second sacrificial layer 212 may be chosen based on, at least in part, etch selectivity, for example.

Referring to FIG. 1F, the activated plug locations 240 may be filled with a plug placeholder material 250 to form a plug 260. The plug placeholder material 250 may be any material suitable for forming a plug, such as, for example, an oxide. In an embodiment, activated plug location 240 may be filled with excess plug placeholder material 250, and a subsequent polish operation and planarization operation may be performed. In the case that the plug placeholder material 250 is planarized following deposition, a CMP process may be used. In another embodiment, however, the activated plug location 240 is filled without metal overfilling, and the polishing operation is omitted. In an embodiment, the plug placeholder material 250 may be a single material layer, or may be formed from several layers. Any suitable deposition process, such as electroplating, chemical vapor deposition, physical vapor deposition, or spin-on, may be used to fill the activated plug location 240 with the plug placeholder material 250.

Referring to FIG. 1G, the second portion 204B of the second sacrificial cross-grating 204 may be removed, to form, in the first portion 204A of the second sacrificial cross-grating 204, a metal line end 270 under the plug 260, where the metal line end 270 may include ILD material 214X of the second ILD layer 214, and further to form ILD lines 280 on a surface 290 of the ESL 216, where also the ILD lines 280 include ILD material 214X. Further, second sacrificial layer material 212X may be between plug placeholder material 250 and second ILD layer material 214X, on both metal line end 270 and ILD lines 280. The removal of the first portion of the second sacrificial cross-grating 204 may transfer the pattern for the plug 260 into the second ILD layer 214. In an embodiment, removing a portion of the second sacrificial cross grating 204 may include applying an isotropic etch technique. In an embodiment, applying the isotropic etch technique may using a wet etching process. In an embodiment, the plug 260 and the metal line end 270 may include sidewalls, and a liner may be deposited by, for example, atomic layer deposition, to protect the sidewalls from damage due to subsequent processing.

Referring to FIG. 1H, a third cross-grating structure 302 may be formed on the ESL 216. The third cross-grating structure 302 may include a third sacrificial cross-grating 304. The third sacrificial cross-grating 304 may include a third cross-grating material 306 such as, for example, but not limited to, metals, such as, for example, but not limited to, aluminum, titanium, zirconium, or tantalum; various oxides, nitrides, or carbides, such as, for example, but not limited to, aluminum oxide, titanium oxide, zirconium oxide, tantalum oxide, titanium nitride, tantalum nitride, silicon nitride, silicon carbide, or silicon dioxide; or semiconductor, such as, for example, but not limited to, amorphous silicon. Material for the sacrificial cross-grating 304 may be chosen based on, at least in part, etch selectivity, for example.

The third sacrificial cross-grating 304 may include a plurality of potential diffusion via locations 330 that may include a diffusion via placeholder material 332. Potential diffusion via locations 330 may be the locations where all possible diffusion vias may be formed in third cross-grating structure 302. The third sacrificial cross-grating 304 may further include a subset of the potential diffusion via locations 330 that are activated diffusion via locations 340 that may include a diffusion via opening 342 from which the diffusion via placeholder material 332 has been removed. Third cross-grating material 306 may surround the potential diffusion via locations 330 and activated diffusion via locations 340.

The subset of potential diffusion via locations 340 may include any number of potential diffusion via locations, from one potential diffusion via location to all of the potential diffusion via locations 330. Further, orthogonal lines in third sacrificial cross-grating 304 that intersect to form the potential diffusion via locations 340 may be spaced at a constant pitch and have a constant width. In other embodiments, the pitch does not need to be constant, nor does the width. It is to be appreciated that the third sacrificial cross-grating 304 may be fabricated by numerous approaches, including, but not limit to, a pitch halving approach, a pitch quartering approach, 193 nm immersion lithography (193i), extreme ultra-violet (EUV) and/or electron-beam direct write (EBDW) lithography, directed self-assembly (DSA), directed selective growth, etc.

Referring to FIG. 1I, ESL material and ILD material may be removed from the bottom of the activated diffusion via location 340 through to a diffusion via guide section, for example, first via guide section 116A, of hardmask layer 116. In an embodiment, removing the ESL material and the ILD material from the bottom of the activated second via location 340 through to the diffusion via guide section of the hardmask layer 116 may include applying an anisotropic etch technique. In an embodiment, applying the anisotropic etch technique may include using a dry etching process. In another embodiment, removing the ESL material and the ILD material from the bottom of the activated second via location 340 through to the first via guide section 116B of the hardmask layer 116 may include applying an isotropic etch technique. In an embodiment, applying the isotropic etch technique may using a wet etching process Referring to FIG. 1J, a diffusion via placeholder material 350 may be deposited in the activated diffusion via location 340. The diffusion via placeholder material may be, for example, CHM.

Referring to FIG. 1K, the third sacrificial cross-grating 304 is removed to form trenches 360 between the ILD lines 280 on the surface 290 of the ESL 216. In an embodiment, removing the third sacrificial cross grating 304 may include applying an isotropic etch technique. In an embodiment, applying the isotropic etch technique may using a wet etching process.

Referring to FIG. 1L, the diffusion via guide section under the activated diffusion via location 340, which may be, for example, a first via guide section 116A, may be removed. In an embodiment, removing the diffusion via guide section under the activated diffusion via location 340 may include applying an anisotropic etch technique. Removal of ESL 216 between ILD lines 280 may cause ESL material 216X of ESL 216 under the second ILD material 214X in ILD lines 280 to become part of ILD lines 280 and to become part of metal line end 270.

Referring to FIG. 1M, the activated diffusion via location 340 and the trenches 360 may be filled with a second conductive metal 370 to form a diffusion via 380 and a metal line 390, respectively, where the surface 162 of the gate via 160 is in contact with the metal line 390. In an embodiment, the diffusion via 380 and metal line 390 may be formed by a dual damascene metallization process. In a dual damascene metallization process, metal features, such as, for example, vias, or metal lines, may be formed separately, as with a single damascene metallization process. However, the metal features may be filled with metal at the same time, rather than filling one metal feature in one operation and filling another metal feature in another operation. Filling the metal features at the same time may result in a reduction in the number of process operations, and may enable vias and metal lines to be self-aligned, as a cross-grating pattern that forms trenches for metal lines 390 may be reused as a template to create diffusion vias 380. Filling the metal features at the same time may also reduce resistance due to metal barrier/seed deposition that may be required to prevent electromigration and to seed the deposition of the metal. The metal barrier/seed layers are typically more resistive than the metal, for example copper, that may be used to form a via or a metal line.

In an embodiment, activated diffusion via locations 340 may be filled with excess second conductive material 370, and a subsequent polish operation and planarization operation may be performed. In the case that the excess second conductive material 370 is planarized following deposition, a chemical mechanical polishing (CMP) process may be used. In another embodiment, however, the activated via location 340 is filled without metal overfilling, and the polishing operation is omitted. In an embodiment, the second conductive material 370 may be a single material layer, or may be formed from several layers, including conductive liner layers and fill layers. Any suitable deposition process, such as electroplating, chemical vapor deposition, physical vapor deposition, or spin-on, may be used to fill the activated gate via location 340 with the second conductive material 370.

Referring to FIG. 1N, the remaining second sacrificial layer material 212X may be removed, to expose a surface 282 of the ILD line 280, a surface 382 of the diffusion via 380, and a surface 392 of the metal line 390, where removal of the remaining second sacrificial layer 212 may include removal of the plugs 260. The surface 282 of the ILD lines 280, the surface 382 of the diffusion via 380, and the surface 392 of the metal line 390 may be planarized after removal of the second sacrificial layer remaining on the ILD lines 280. In an embodiment, a chemical mechanical polishing (CMP) process may be used to remove the second sacrificial layer 212 remaining on the ILD lines 280.

Although embodiments herein may be described in terms of a plurality of vias, metal line ends, metal lines, or ILD lines, embodiments herein may include a single via, a single metal line end, a single metal line, or a single ILD lines. Although embodiments herein may be described in terms of a single via, metal line end, metal line, or ILD line, embodiments herein may include any number of vias, metal line ends, metal lines, or ILD lines. Although embodiments herein may be described as including a particular number of vias, metal line ends, metal lines, or ILD lines, embodiments herein may include any number of vias, metal line ends, metal lines, or ILD lines.

Although embodiments herein may be described in terms of gate vias and gate contacts of a MOSFET device or in terms of diffusion vias for diffusion contacts, such as a source or a drain of a MOSFET device, embodiments herein are not limited to MOSFET devices. Embodiments herein may be used with any other type of device that may be used with an interconnect structure such as interconnect structure 100. Such other types of devices may include, for example, but not limited to, a BJT device. In such an embodiment, the vias described herein may be base contact vias, emitter contact vias, or collector contact vias. Further, in an embodiment, a via may be generally referred to as a first via, a second via, etc.

Figure 2:
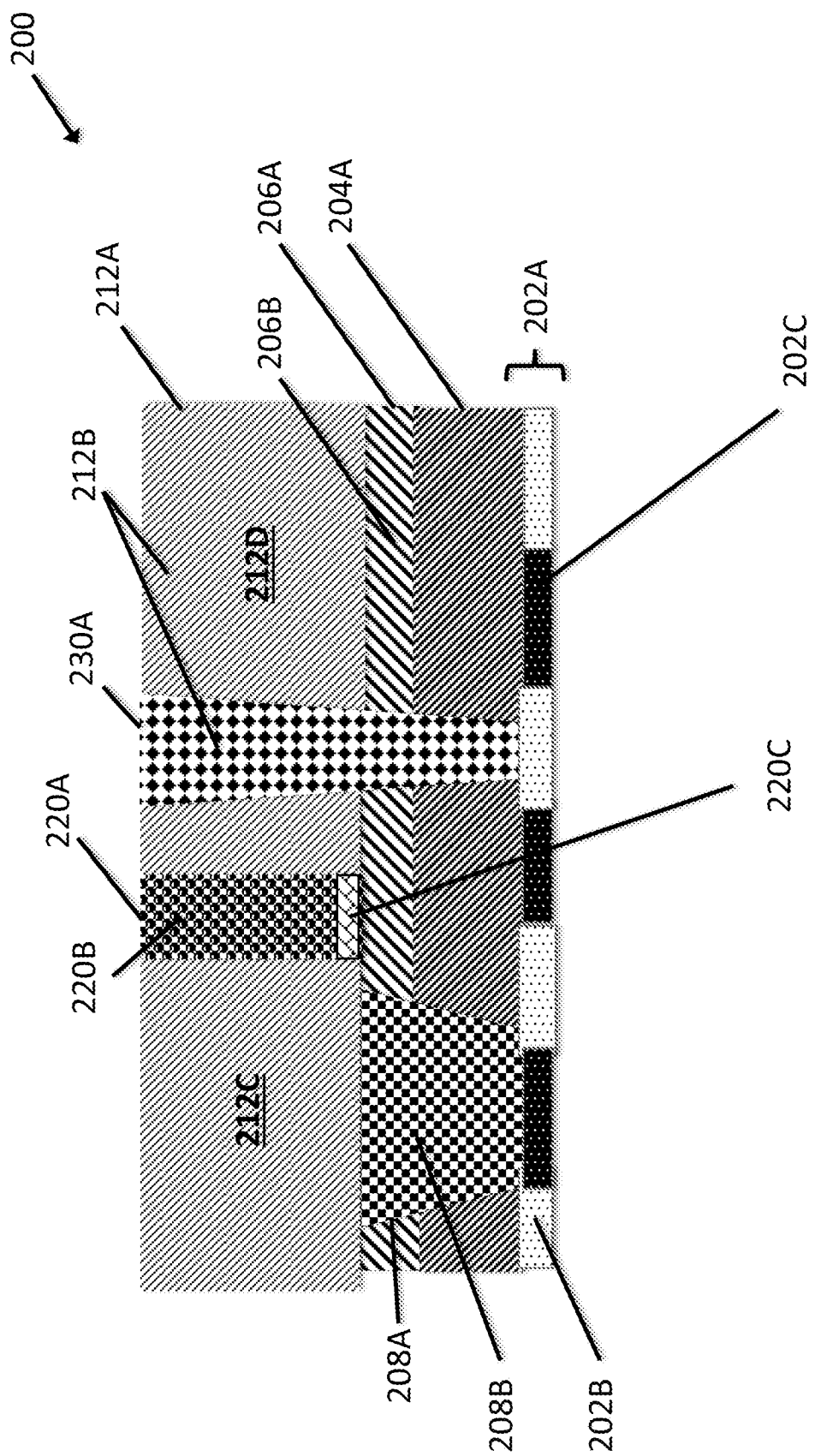
FIG. 2 illustrates an interconnect structure, in accordance with an embodiment of the present disclosure.

FIG. 2 illustrates a cross-sectional view of an interconnect structure for an integrated circuit, in accordance with an embodiment of the present disclosure. In an embodiment, an interconnect structure 200 may include an ILD layer 204A on a hardmask layer 202A, where the ILD layer 204A may include a first ILD layer opening (not shown) and a second ILD layer opening (not shown). An ESL 206A may be on the ILD layer 204A. The ESL layer 206A may include a first ILD material 206B, and the ESL 206A may include a first ESL opening (not shown) that is aligned with the first ILD opening to form a gate via opening (not shown). The ESL 206A may further include a second ILD opening (not shown) that is aligned with the second ILD opening.

The interconnect structure 200 may further include a gate via 208A in the first via opening, where the gate via 208A may include a first metal fill 208B, as described above. The interconnect structure 200 may further include a second ILD layer (not shown) on the ESL 206A, where the second ILD layer may include a second ILD material (not shown). The interconnect structure 200 may further include a metal line 212A in the second ILD layer, where the metal line 212A is in contact with the gate via, and where the metal line 212A may include a first metal opening (not shown), and where the metal line 212A may include a second metal opening (not shown) aligned with the second ILD opening and the ESL opening to form a second via opening (not shown).

The interconnect structure 200 may further include a metal line end 220A in the first metal opening, to electrically isolate a first part 212C of the metal line 212A with the first metal opening from a second part 212D of the metal line 212A, where the metal line end 220A may include a third dielectric material 220B and an ES material 220C between the first ESL 206A and the second dielectric material 220B. The interconnect structure 200 may further include a diffusion via 230A in the second via opening, where the diffusion via may include the second metal fill 212B.

In an embodiment, the first via is a gate via, and the second via is a diffusion via. In an embodiment, the ESL 206A may include a metal oxide. In an embodiment, the first ILD layer 204A and the second ILD layer 212A may include the same dielectric material. In an embodiment, the second ILD layer 212A and the metal line end 220A may include the same dielectric material. In an embodiment, the ES material may include a metal oxide. In an embodiment, the first metal fill 212B and the second metal fill 220B may include, for example, but is not limited to, aluminum, titanium, zirconium, hafnium, vanadium, ruthenium, copper, nickel, palladium, platinum, copper, tungsten, gold, or silver, or alloys thereof. In an embodiment, the hardmask layer 202A may include a first material 202B adjacent to a second material 202C, where the first material 202B is able to remain if the second material 202C is etched and where the second material 202C is able to remain if the first material 202B is etched.

Figure 3:
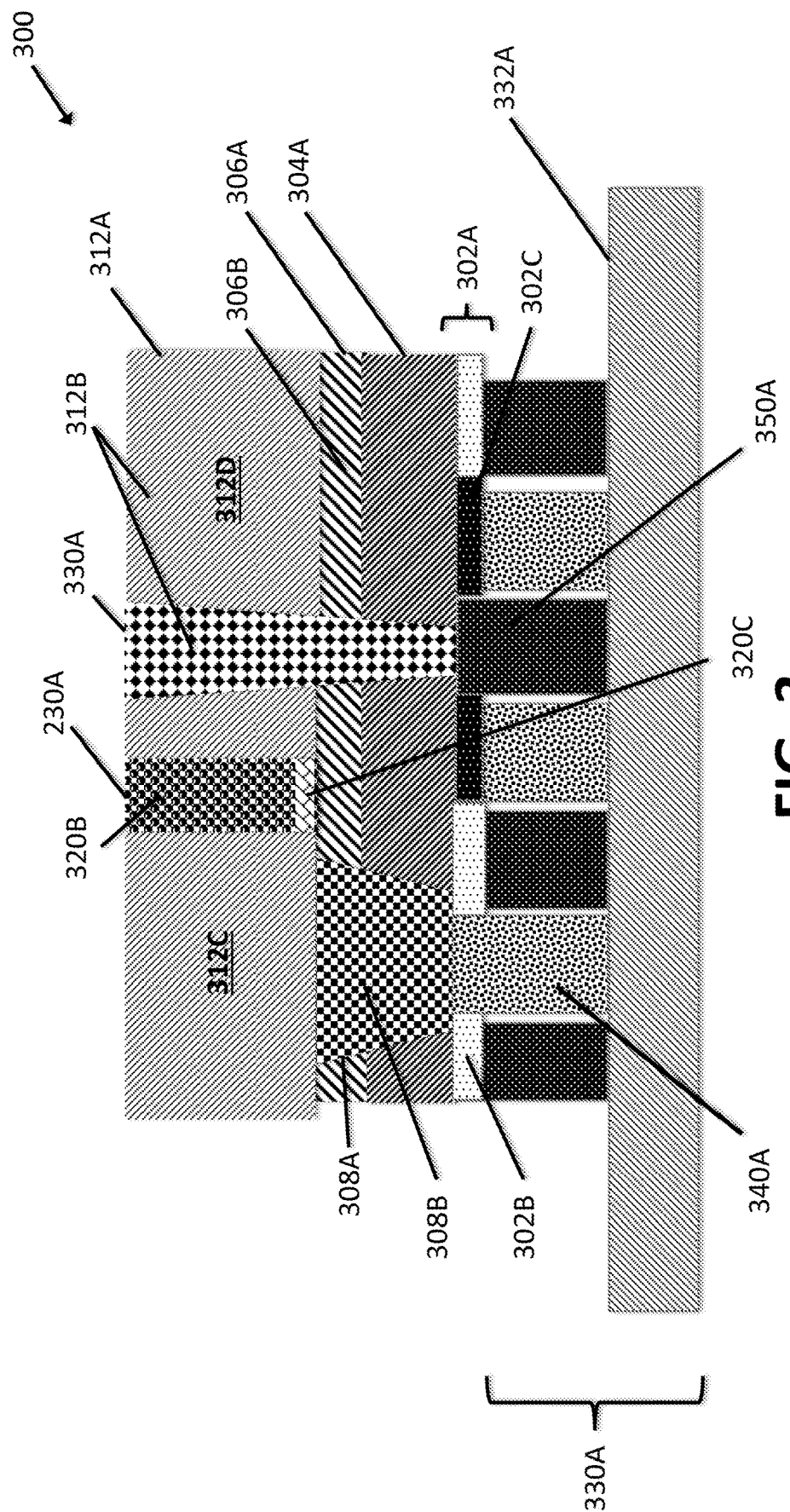
FIG. 3 illustrates an integrated circuiting having conductive via and metal line end formation for BEOL interconnect fabrication, in accordance with another embodiment of the present disclosure.

FIG. 3 illustrates a cross-sectional view of an integrated circuit structure. Integrated circuit structure 300 may include a first ILD layer 304A on a hardmask layer 302A, where the hardmask layer may include a first material 302B adjacent to a second material 302C, where the first material 302B is able to remain if the second material 302C is removed, for example, by etching, and where the second material 302C is able to remain if the first material 302B is removed, for example, by etching. Integrated circuit structure 300 may further include an ESL 306A on the first ILD layer 304A. Integrated circuit structure 300 may further include a gate via 308A passing through a first aligned opening (not shown) in the first ILD layer 304A and in ESL 306A. Integrated circuit structure 300 may further include a second ILD layer (not shown) on the ESL 306A.

Integrated circuit structure 300 may further include a metal line 312A in the second ILD layer, where the metal line 312A is in contact with the gate via 308A. Integrated circuit structure 300 may further include a metal line end 320A in the metal line 312A, to electrically isolate a first part 312C of the metal line from a second part 312D of the metal line 312A. Integrated circuit structure 300 may further include a diffusion via 330A passing through a second aligned opening (not shown) in the metal line 312A, in the ESL 306A and in the first ILD layer 304A.

Integrated circuit structure 300 may further include a semiconductor device 330A. The semiconductor device 330A may include a semiconductor substrate 332A, a gate contact 340A on the semiconductor substrate 332A, where the gate via 308A is in contact with the gate contact 340A through removal of a portion of the first material 302B in the metal layer 302A. The semiconductor device 330A may further include a diffusion contact 350A on the semiconductor substrate 330A, where the diffusion via 330A is in contact with the diffusion contact 350A through removal of a portion of the second material 302C in the metal layer.

A resulting structure such as described in association with FIG. 1N or 2 may subsequently be used as a foundation for forming subsequent vias and metal line ends. Alternatively, the structures of FIG. 1N or 2 may represent the final metal interconnect layer in an integrated circuit. It is to be appreciated that the above process operations may be practiced in alternative sequences, not every operation need be performed and/or additional process operations may be performed. Although the above processes (e.g., FIGS. 1A-1N) of fabricating conductive vias and metal line ends for a BEOL interconnect structure have been described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, and/or any other associated action with microelectronic component fabrication. For above process flows that may use spacer-based pitch division, applications of directed self-assembly (DSA) processes may be used instead in one or more locations of the process flow. In any case, the resulting structures enable fabrication of vias that are directly centered on underlying metal lines, which may be referred to as self-aligned vias. That is, the vias may be wider than, narrower than, or the same thickness as the underlying metal lines, e.g., due to non-perfect selective etch processing. Nonetheless, in an embodiment, the centers of the vias may be directly aligned (match up) with the centers of the metal lines. As such, in an embodiment, offset due to conventional lithograph/dual damascene patterning that must otherwise be tolerated, is not a factor for the resulting structures described herein.

Embodiments described above may be implemented to enable strong self-alignment and mitigation of edge placement issues that otherwise plague conventional patterning. Accordingly, adjacent metal features have different etch stop materials such that even if the via pattern spans adjacent metal lines, selective via etching drives the via to land on the correct metal line beneath the via. Embodiments may be implemented to enable integration of a pin-hole ash patterning process, a single damascene metallization process, and a dual damascene metallization process, along with colored underlayers. This may be evidenced by, for example, vias and metal line ends fabricated using single and dual damascene metallization processes together with a bi-layer ILD stack and an extra etch stop layer relative to conventional interconnect structures. This enables, for example, preformed via and plug selection using an isotropic etch process to be integrated onto a hardmask layer with alternative via guide sections, and combines a single damascene metallization process and a dual damascene metallization process. Embodiments thus may be implemented to enable the integrating of the pin-hole ash patterning process and patterning gate vias and diffusion vias, and not having to pattern the vias in separate etch processes. Embodiments may be implemented to enable robust interconnect reliability and low via/contact resistance.

In an embodiment, as used throughout the present description, an interlayer dielectric (ILD) material may be composed of or may include a layer of a dielectric or insulating material. Examples of suitable dielectric materials may include, but are not limited to, oxides of silicon (e.g., silicon dioxide ($SiO_2$)), nitrides of silicon (e.g., silicon nitride ($Si_3N_4$)), doped oxides of silicon, fluorinated oxides of silicon, carbon doped oxides of silicon, various low-k dielectric materials known in the arts, and combinations thereof. The ILD material may be formed by conventional techniques, such as, for example, chemical vapor deposition (CVD), physical vapor deposition (PVD), or by other deposition techniques.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal may include alloys, stacks, and other combinations of multiple metals. For example, the metal interconnect lines may include barrier layers, stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a barrier layer and a conductive fill material. In one embodiment, the barrier layer is a tantalum or tantalum nitride layer, or a combination thereof. In one embodiment, the conductive fill material is a material such as, but not limited to, copper, aluminum, titanium, zirconium, hafnium, vanadium, ruthenium, cobalt, nickel, palladium, platinum, tungsten, silver, or gold, or alloys thereof. The interconnect lines are also sometimes referred to in the art as traces, wires, lines, metal, metal lines, or simply interconnect.

In an embodiment, as is also used throughout the present description, hardmask materials (and in some instances etch stop layers) are composed of materials different from the interlayer dielectric material. In one embodiment, different hardmask materials may be used in different regions so as to provide different growth or etch selectivity to each other and to the underlying dielectric and metal layers. In some embodiments, a hardmask layer may include a layer of a nitride of silicon (e.g., silicon nitride) or a layer of an oxide of silicon, or both, or a combination thereof. Other suitable materials may include carbon-based materials, such as silicon carbide. In another embodiment, a hardmask material may include a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the art may be used depending upon the particular implementation. The hardmask layers may be formed by CVD, PVD, or by other deposition techniques.

It is to be appreciated that the layers and materials described in association with FIGS. 1A-1N, 2, and 3 are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates may include, but are not limited to, single crystal silicon, polycrystalline silicon, silicon on insulator (SOI), and compound semiconductors, such as, for example, gallium arsenide (GaAs) or other III-V semiconductor substrates, as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIG. 1N (i.e., as starting from FIG. 1A) may be fabricated on underlying lower level interconnect layers.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 4:
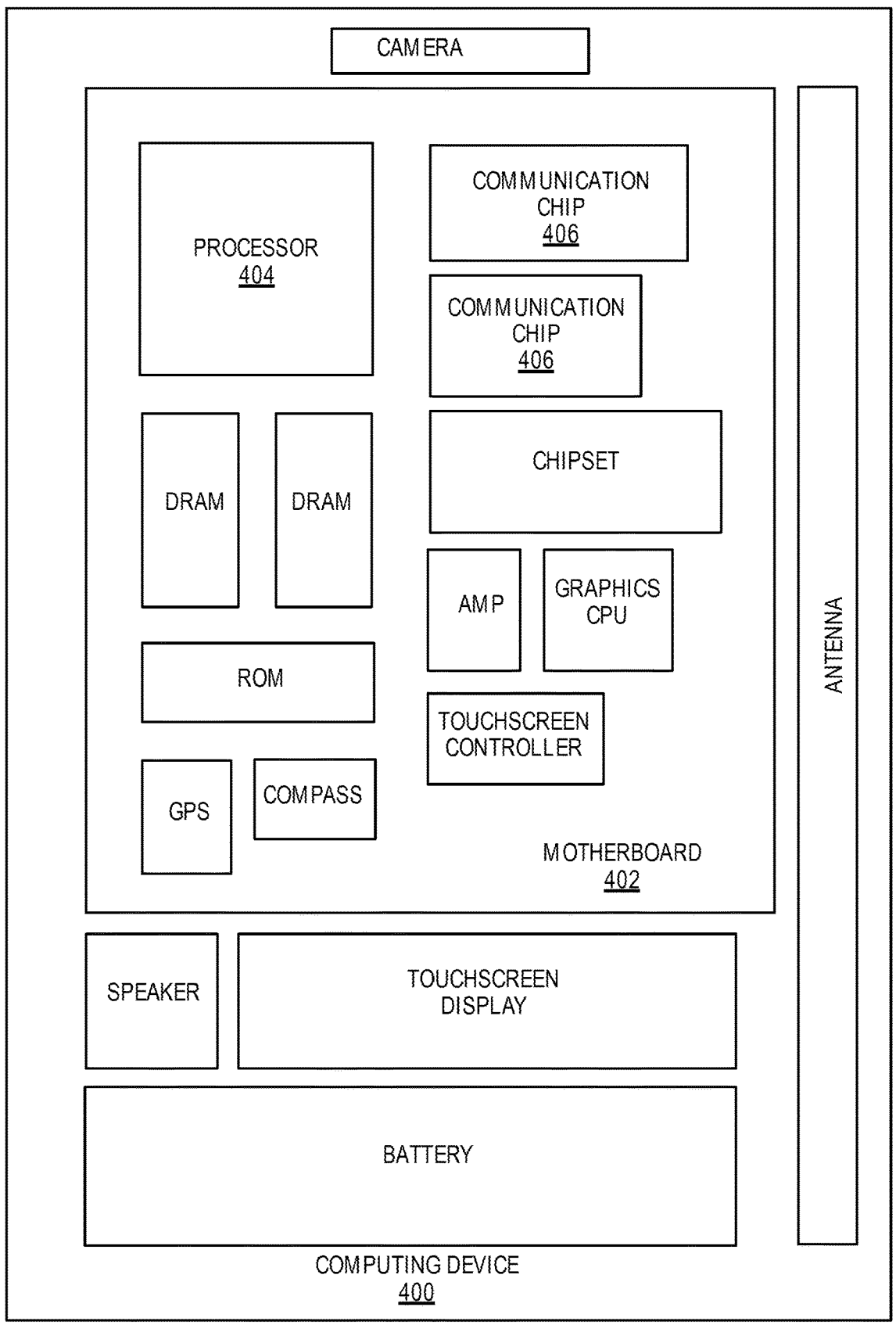
FIG. 4 illustrates a computing device in accordance with one implementation of an embodiment of the present disclosure.

FIG. 4 illustrates a computing device 400 in accordance with one implementation of the disclosure. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the disclosure, the integrated circuit die of the processor includes one or more structures, such as conductive vias and metal line ends built in accordance with implementations of embodiments of the disclosure. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the disclosure, the integrated circuit die of the communication chip includes one or more structures, such as conductive vias and metal line ends built in accordance with implementations of embodiments of the disclosure.

In further implementations, another component housed within the computing device 400 may contain an integrated circuit die that includes one or more structures, such as conductive vias and metal line ends built in accordance with implementations of embodiments of the disclosure.

In various implementations, the computing device 400 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Figure 5:
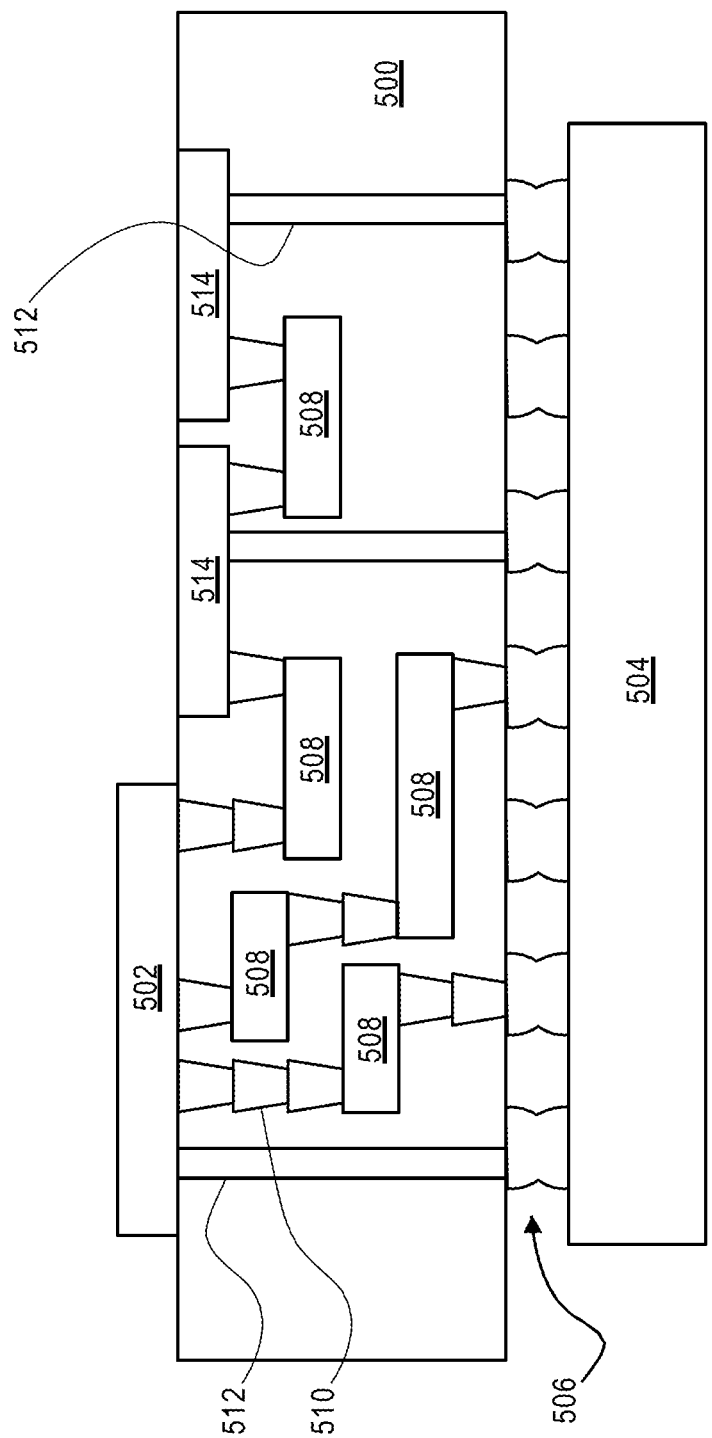
FIG. 5 illustrates an interposer implementing one or more embodiments of the disclosure.

FIG. 5 illustrates an interposer 500 that includes one or more embodiments of the disclosure. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500. In accordance with embodiments of the disclosure, apparatuses or processes disclosed herein may be used in the fabrication of interposer 500.

Thus, embodiments of the present disclosure include conductive via and metal line end fabrication, and the resulting structures.

Some non-limiting examples are provided below.

EXAMPLES

Example 1 may include an interconnect structure, comprising: a first inter-layer dielectric (ILD) on a hardmask layer, wherein the ILD includes a first ILD opening and a second ILD opening; an etch stop layer (ESL) on the ILD layer, wherein the ESL includes a first ESL opening aligned with the first ILD opening to form a first via opening, and wherein the ESL layer includes a second ESL opening aligned with the second ILD opening; a first via in the first via opening; a second ILD layer on the first ESL; a metal line in the second ILD layer, wherein the metal line is in contact with the first via, and wherein the metal line includes a first metal opening, and wherein the metal line includes a second metal opening aligned with the second ILD opening and the ESL opening to form a second via opening; a metal line end in the first metal opening; and a second via in the metal line, wherein the second via is in the second via opening.

Example 2 may include the interconnect structure of Example 1 or some other example herein, wherein the first via is a gate via and wherein the second via is a diffusion via.

Example 3 may include the interconnect structure of Example 1, 2, or some other example herein, wherein the first ILD layer includes a first dielectric material and the second ILD layer includes a second dielectric material.

Example 4 may include the interconnect structure of Example 3 or some other example herein, wherein the first ILD layer and the second ILD layer include a same dielectric material.

Example 5 may include the interconnect structure of Example 1, 2, or some other example herein, wherein the second ILD layer and the metal line end include a same dielectric material.

Example 6 may include the interconnect structure of Example 1, 2, or some other example herein, wherein the hardmask layer includes a first material adjacent to a second material, wherein the first material is able to remain if the second material is etched.

Example 7 may include the interconnect structure of Example 6 or some other example herein, further comprising: a semiconductor device, wherein the semiconductor device includes, a semiconductor substrate; a gate contact on the semiconductor substrate, wherein the first via is a gate via is in contact with the gate contact through removal of a portion of the first material in the hardmask layer; and a diffusion contact on the semiconductor substrate, wherein the second via is a diffusion via in contact with the diffusion contact through removal of a portion of the second material in the hardmask layer.

Example 8 may include a method of fabricating an interconnect structure for an integrated circuit, the method comprising: forming a first cross-grating structure comprising a first sacrificial cross-grating on a first film stack, wherein the first sacrificial cross-grating structure includes a plurality of potential gate via locations that include a gate via placeholder material, and wherein a subset of the potential gate via locations are activated gate via locations that include gate via openings from which the gate via placeholder material has been removed; removing first film stack material from a bottom of the activated gate via locations through to a gate contact; filling the activated gate via location with a first conductive material to form a gate via; removing the first sacrificial cross-grating, to expose a surface of a first ILD layer of the first film stack and a surface of the gate via in the first ILD layer, wherein removal of the first sacrificial cross-grating includes removal of a remainder of the first film stack above the first ILD layer; forming on the surface of the first ILD layer a second cross-grating structure comprising a second sacrificial cross-grating on a second film stack, wherein the second sacrificial cross-grating includes a first portion, a second portion, and a plurality of potential plug locations that include a plug placeholder material, and wherein a subset of the potential plug locations are activated plug locations that include a plug opening from which the plug placeholder material has been removed; filling the activated plug locations with a plug placeholder material to form a plug; removing the second portion of the second sacrificial cross-grating, to form, in the first portion of the second sacrificial cross-grating, a metal line end under the plug, wherein the metal line end includes ILD material of an ILD layer of the second film stack, and further to form ILD lines on the surface of an etch stop layer (ESL) of the second film stack, where the ILD lines include the ILD material; forming on the ESL a third cross-grating structure comprising a third sacrificial cross-grating, wherein the third sacrificial cross-grating includes a plurality of potential diffusion via locations that include a diffusion via placeholder material, and wherein a subset of the potential diffusion via locations are activated diffusion via locations that include an opening from which the diffusion via placeholder material has been removed; removing ESL material and first ILD material from a bottom of the activated diffusion via location through to a diffusion via guide section in a hardmask layer in the first film stack; removing the third sacrificial cross-grating, to form trenches between the ILD lines on the surface of the ESL; removing the diffusion via guide section; filling the activated diffusion via locations with a second conductive material to form diffusion vias; filling the trenches with the second conductive material to form a metal line, wherein the surface of the gate via is in contact with the metal line; and removing a sacrificial material of a sacrificial layer of the second film stack, to expose a surface of the metal lines, the ILD lines, the metal line ends, and the diffusion via, and wherein a removal of the sacrificial material of the sacrificial layer of the second film stack includes a removal of the plugs.

Example 9 may include the method of Example 8 or some other example herein, wherein removing the first film stack material from the bottom of the activated gate via location comprises applying an anisotropic etch technique.

Example 10 may include the method of Example 9 or some other example herein, wherein applying the anisotropic etch technique comprises using a dry etching process.

Example 11 may include the method of Example 8, 9, or some other example herein, wherein filling the activated gate via location with the first conductive material to form the gate via comprises: filling the activated gate via location with excess first conductive material; and polishing the excess first conductive material, to remove the excess first conductive material.

Example 12 may include the method of Example 8, 9, or some other example herein, further comprising removing the first film stack material from the bottom of the activated gate via location through to a gate via guide section in a hardmask layer in the first film stack, wherein the gate via guide section is above the gate contact Example 13 may include the method of Example 8, 9, or some other example herein, wherein the plug and the metal line end include sidewalls, and wherein the method further comprises depositing a liner by atomic layer deposition, to protect the sidewalls.

Example 14 may include the method of Example 8, 9, or some other example herein, wherein removing the third sacrificial cross-grating comprises applying an isotropic etching technique.

Example 15 may include the method of Example 8, 9, or some other example herein, further comprising depositing a diffusion via placeholder material in the activated diffusion via locations.

Example 16 may include the method of Example 8, 9, or some other example herein, wherein filling the activated diffusion via locations with the second conductive material to form the diffusion vias comprises filling the activated diffusion via locations with excess second conductive material; and polishing the excess second conductive material.

Example 17 may include a method of fabricating an interconnect structure for an integrated circuit, the method comprising: forming a first cross-grating structure comprising a sacrificial cross-grating on a first film stack, wherein the first cross-grating structure includes a plurality of potential gate via locations that include a gate via placeholder material, and wherein a subset of the potential gate via locations are activated gate via locations that include gate via opening from which the gate via placeholder material has been removed; removing first film stack material from a bottom of the activated gate via locations through to a gate contact; forming a gate via in a first ILD layer of the first film stack, wherein the gate via includes a first conductive material in the activated gate via location; exposing a surface of the first ILD layer; forming on the first ILD layer a second cross-grating structure comprising a second sacrificial cross-grating on a second film stack wherein the second sacrificial cross-grating includes a first portion, a second portion, and a plurality of potential plug locations that include a plug placeholder material, and wherein a subset of the potential plug locations are activated plug locations that include an opening from which the plug placeholder material has been removed; forming a plug that includes a plug material in the activated plug locations; forming, on a surface of an etch stop layer (ESL) of the second film stack, a metal line end under the plug, by removing the first portion of the second sacrificial cross-grating, wherein the metal line end includes ILD material of an ILD layer of the second film stack, forming ILD lines on the surface of the ESL by removing the first portion of the second sacrificial cross-grating, and wherein the ILD lines include the ILD material; forming on the ESL a third cross-grating structure comprising a third sacrificial cross-grating, wherein the third sacrificial cross-grating includes a plurality of potential diffusion via locations that include a diffusion via placeholder material, and wherein a subset of the potential diffusion via locations are activated diffusion via locations that include an opening from which the diffusion via placeholder material has been removed; removing ESL material and the ILD material from a bottom of the activated diffusion via location through to a diffusion contact; depositing a diffusion via placeholder material in the activated via locations; forming trenches between the ILD lines on the surface of the ESL; forming a diffusion via that includes a second conductive material in the activated diffusion via locations; forming a metal line that includes the second conductive material in the trenches, wherein the surface of the gate via is in contact with the metal line; and removing a sacrificial material of a sacrificial layer of the second film stack, to planarize a surface of the metal line, the ILD lines, the metal line end, and the diffusion via, wherein a removal of the sacrificial material of the sacrificial layer of the second film stack includes a removal of the plugs.

Example 18 may include the method of Example 17 or some other example herein, wherein exposing the surface of the first ILD layer comprises removing the first sacrificial cross-grating, wherein removal of the first sacrificial cross-grating includes removal of a remainder of the first film stack above the first ILD layer.

Example 19 may include the method of Example 17, 18, or some other example herein, further comprising removing the ESL material and the ILD material from the bottom of the activated diffusion via location through to a diffusion via guide section in a hardmask layer in the first film stack, wherein the diffusion via guide section is above the diffusion contact.

Example 20 may include the method of Example 17, 18, or some other example herein, wherein forming the trenches between the ILD lines on the surface of the ESL comprises removing the third sacrificial cross-grating.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An interconnect structure, comprising:
   an inter-layer dielectric (ILD) on a hardmask layer, wherein the ILD includes a first ILD opening and a second ILD opening;
   an etch stop layer (ESL) on the ILD layer, wherein the ESL includes a first ESL opening aligned with the first ILD opening to form a first via opening, and wherein the ESL layer includes a second ESL opening aligned with the second ILD opening;
   a first via in the first via opening;
   a metal line in contact with the first via, and wherein the metal line includes a first metal opening, and wherein the metal line includes a second metal opening aligned with the second ILD opening and the second ESL opening to form a second via opening;
a metal line end in the first metal opening; and
a second via in the metal line, wherein the second via is in the second via opening.

2. The interconnect structure of claim 1, wherein the first via is a gate via and wherein the second via is a diffusion via.

3. The interconnect structure of claim 1, wherein the ILD layer includes a first dielectric material and the second ILD layer includes a second dielectric material.

4. The interconnect structure of claim 1, wherein the hardmask layer includes a first material adjacent to a second material, wherein the first material is able to remain if the second material is etched.

5. The interconnect structure of claim 4, further comprising:
a semiconductor device, wherein the semiconductor device includes, a semiconductor substrate;
a gate contact on the semiconductor substrate, wherein the first via is a gate via is in contact with the gate contact through removal of a portion of the first material in the hardmask layer; and
a diffusion contact on the semiconductor substrate, wherein the second via is a diffusion via in contact with the diffusion contact through removal of a portion of the second material in the hardmask layer.

6. A method of fabricating an interconnect structure for an integrated circuit, the method comprising:
forming a first cross-grating structure comprising a first sacrificial cross-grating on a first film stack, wherein the first sacrificial cross-grating structure includes a plurality of potential gate via locations that include a gate via placeholder material, and wherein a subset of the potential gate via locations are activated gate via locations that include gate via openings from which the gate via placeholder material has been removed;
removing first film stack material from a bottom of the activated gate via locations through to a gate contact;
filling the activated gate via location with a first conductive material to form a gate via; removing the first sacrificial cross-grating, to expose a surface of a first ILD layer of the first film stack and a surface of the gate via in the first ILD layer, wherein removal of the first sacrificial cross-grating includes removal of a remainder of the first film stack above the first ILD layer;
forming on the surface of the first ILD layer a second cross-grating structure comprising a second sacrificial cross-grating on a second film stack, wherein the second sacrificial cross-grating includes a first portion, a second portion, and a plurality of potential plug locations that include a plug placeholder material, and wherein a subset of the potential plug locations are activated plug locations that include a plug opening from which the plug placeholder material has been removed;
filling the activated plug locations with a plug placeholder material to form a plug;
removing the second portion of the second sacrificial cross-grating, to form, in the first portion of the second sacrificial cross-grating, a metal line end under the plug, wherein the metal line end includes ILD material of an ILD layer of the second film stack, and further to form ILD lines on the surface of an etch stop layer (ESL) of the second film stack, and wherein the ILD lines include the ILD material;
forming on the ESL a third cross-grating structure comprising a third sacrificial cross-grating, wherein the third sacrificial cross-grating includes a plurality of potential diffusion via locations that include a diffusion via placeholder material, and wherein a subset of the potential diffusion via locations are activated diffusion via locations that include an opening from which the diffusion via placeholder material has been removed;
removing ESL material and first ILD material from a bottom of the activated diffusion via location through to a diffusion via guide section in a hardmask layer in the first film stack;
removing the third sacrificial cross-grating, to form trenches between the ILD lines on the surface of the ESL; removing the diffusion via guide section;
filling the activated diffusion via locations with a second conductive material to form diffusion vias;
filling the trenches with the second conductive material to form a metal line, wherein the surface of the gate via is in contact with the metal line; and removing a sacrificial material of a sacrificial layer of the second film stack, to expose a surface of the metal lines, the ILD lines, the metal line ends, and the diffusion via, and wherein a removal of the sacrificial material of the sacrificial layer of the second film stack includes a removal of the plugs.

7. The method of claim 6, wherein removing the first film stack material from the bottom of the activated gate via location comprises applying an anisotropic etch technique.

8. The method of claim 7, wherein applying the anisotropic etch technique comprises using a dry etching process.

9. The method of claim 6, wherein filling the activated gate via location with the first conductive material to form the gate via comprises:
filling the activated gate via location with excess first conductive material; and polishing the excess first conductive material, to remove the excess first conductive material.

10. The method of claim 6, further comprising removing the first film stack material from the bottom of the activated gate via location through to a gate via guide section in a hardmask layer in the first film stack, wherein the gate via guide section is above the gate contact.

11. The method of claim 6, wherein the plug and the metal line end include sidewalls, and wherein the method further comprises depositing a liner by atomic layer deposition, to protect the sidewalls.

12. The method of claim 6, wherein removing the third sacrificial cross-grating comprises applying an isotropic etching technique.

13. The method of claim 6, further comprising depositing a diffusion via placeholder material in the activated diffusion via locations.

14. The method of claim 6, wherein filling the activated diffusion via locations with the second conductive material to form the diffusion vias comprises:
filling the activated diffusion via locations with excess second conductive material; and
polishing the excess second conductive material.

15. A method of fabricating an interconnect structure for an integrated circuit, the method comprising:
forming a first cross-grating structure comprising a sacrificial cross-grating on a first film stack, wherein the first cross-grating structure includes a plurality of potential gate via locations that include a gate via placeholder material, and wherein a subset of the potential gate via locations are activated gate via locations that include gate via opening from which the gate via placeholder material has been removed;

removing first film stack material from a bottom of the activated gate via locations through to a gate contact; forming a gate via in a first ILD layer of the first film stack, wherein the gate via includes a first conductive material in the activated gate via location;

exposing a surface of the first ILD layer;

forming on the first ILD layer a second cross-grating structure comprising a second sacrificial cross-grating on a second film stack wherein the second sacrificial cross-grating includes a first portion, a second portion, and a plurality of potential plug locations that include a plug placeholder material, and wherein a subset of the potential plug locations are activated plug locations that include an opening from which the plug placeholder material has been removed;

forming a plug that includes a plug material in the activated plug locations;

forming, on a surface of an etch stop layer (ESL) of the second film stack, a metal line end under the plug, by removing the first portion of the second sacrificial cross-grating, wherein the metal line end includes ILD material of an ILD layer of the second film stack;

forming ILD lines on the surface of the ESL by removing the first portion of the second sacrificial cross-grating, wherein the ILD lines include the ILD material of the ILD layer;

forming on the ESL a third cross-grating structure comprising a third sacrificial cross-grating, wherein the third sacrificial cross-grating includes a plurality of potential diffusion via locations that include a diffusion via placeholder material, and wherein a subset of the potential diffusion via locations are activated diffusion via locations that include an opening from which the diffusion via placeholder material has been removed;

removing ESL material and the ILD material from a bottom of the activated diffusion via location through to a diffusion contact; depositing a diffusion via placeholder material in the activated via locations;

forming trenches between the ILD lines on the surface of the ESL;

forming a diffusion via that includes a second conductive material in the activated diffusion via locations;

forming a metal line that includes the second conductive material in the trenches, wherein the surface of the gate via is in contact with the metal line; and removing a sacrificial material of a sacrificial layer of the second film stack, to planarize a surface of the metal line, the ILD lines, the metal line end, and the diffusion via, wherein a removal of the sacrificial material of the sacrificial layer of the second film stack includes a removal of the plugs.

16. The method of claim 15, wherein exposing the surface of the first ILD layer comprises removing the first sacrificial cross-grating, wherein removal of the first sacrificial cross-grating includes removal of a remainder of the first film stack above the first ILD layer.

17. The method of claim 15, further comprising removing the ESL material and the ILD material from the bottom of the activated diffusion via location through to a diffusion via guide section in a hardmask layer in the first film stack, wherein the diffusion via guide section is above the diffusion contact.

18. The method of claim 15, wherein forming the trenches between the ILD lines on the surface of the ESL comprises removing the third sacrificial cross-grating.

\* \* \* \* \*